United States Patent
Harada et al.

(10) Patent No.: US 9,460,914 B2
(45) Date of Patent: Oct. 4, 2016

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: HITACHI KOKUSAI ELECTRIC INC., Tokyo (JP)

(72) Inventors: Katsuyoshi Harada, Toyama (JP); Yoshiro Hirose, Toyama (JP); Atsushi Sano, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/856,244

(22) Filed: Sep. 16, 2015

(65) Prior Publication Data
US 2016/0079056 A1  Mar. 17, 2016

(30) Foreign Application Priority Data
Sep. 17, 2014  (JP) .................................. 2014-188429

(51) Int. Cl.
| | | |
|---|---|---|
| H01L 21/02 | (2006.01) | |
| C23C 16/34 | (2006.01) | |
| C23C 16/36 | (2006.01) | |
| C23C 16/38 | (2006.01) | |
| C23C 16/455 | (2006.01) | |
| H01J 37/32 | (2006.01) | |

(52) U.S. Cl.
CPC ....... *H01L 21/02205* (2013.01); *C23C 16/342* (2013.01); *C23C 16/36* (2013.01); *C23C 16/45531* (2013.01); *C23C 16/45542* (2013.01); *H01J 37/32082* (2013.01); *H01J 37/32449* (2013.01); *H01J 37/32779* (2013.01); *H01L 21/02175* (2013.01); *H01L 21/02274* (2013.01)

(58) Field of Classification Search
CPC .................... H01L 21/02205; H01L 21/0228; H01L 21/02274; H01L 21/02112; H01L 21/02271; C23C 16/342; C23C 16/36; C23C 16/38
See application file for complete search history.

(56) References Cited

U.S. PATENT DOCUMENTS

| | | | |
|---|---|---|---|
| 6,815,350 B2 * | 11/2004 | Kim | ........................ C23C 16/30 257/E21.292 |
| 6,962,876 B2 * | 11/2005 | Ahn | ........................ C23C 16/30 257/E21.292 |
| 7,351,668 B2 | 4/2008 | Chou et al. | |
| 2003/0082296 A1 * | 5/2003 | Elers | ....................... C23C 16/34 174/256 |

FOREIGN PATENT DOCUMENTS

| | | |
|---|---|---|
| JP | 2004-186403 A | 7/2004 |
| JP | 2009-65203 A | 3/2009 |

* cited by examiner

*Primary Examiner* — Karen Kusumakar
(74) *Attorney, Agent, or Firm* — Volpe and Koenig, P.C.

(57) ABSTRACT

A technique includes forming a film having a borazine ring structure and containing boron and nitrogen on a substrate by intermittently performing an act of simultaneously performing: (a) supplying borazine-based gas including a ligand to the substrate; and (b) supplying a ligand desorption gas which desorbs the ligand to the substrate, wherein the (a) and (b) are performed under a condition where the borazine ring structure in the borazine-based gas is held.

16 Claims, 8 Drawing Sheets

METHOD OF MANUFACTURING SEMICONDUCTOR DEVICE, SUBSTRATE PROCESSING APPARATUS, AND NON-TRANSITORY COMPUTER-READABLE RECORDING MEDIUM

BACKGROUND OF THE INVENTION

1. Field of the Invention

The present invention relates to a method of manufacturing a semiconductor device, a substrate processing apparatus, and a non-transitory computer-readable recording medium.

2. Description of the Related Art

As one of the processes of manufacturing a semiconductor device, a process of forming a film having a borazine ring structure and containing boron (B) and nitrogen (N) (hereinafter, also referred to as a boron nitride film having a borazine ring structure) on a substrate may be performed.

SUMMARY OF THE INVENTION

An object of the present invention is to provide a technology capable of improving a deposition rate of a boron nitride film including a borazine ring structure.

According to one aspect of the present invention, there is provided a technique, including forming a film having a borazine ring structure and containing boron and nitrogen on a substrate by intermittently performing an act of simultaneously performing: (a) supplying borazine-based gas including a ligand to the substrate; and (b) supplying a ligand desorption gas which desorbs the ligand to the substrate, wherein the (a) and (b) are performed under a condition where the borazine ring structure in the borazine-based gas is held.

According to the present invention, it is possible to improve a deposition rate of a boron nitride film including a borazine ring structure.

DETAILED DESCRIPTION OF THE PREFERRED EMBODIMENTS

Embodiment of the Present Invention

Hereinafter, an embodiment of the present invention will be described with reference to FIGS. 1 to 3.

(1) Configuration of Substrate Processing Apparatus

Figure 1:
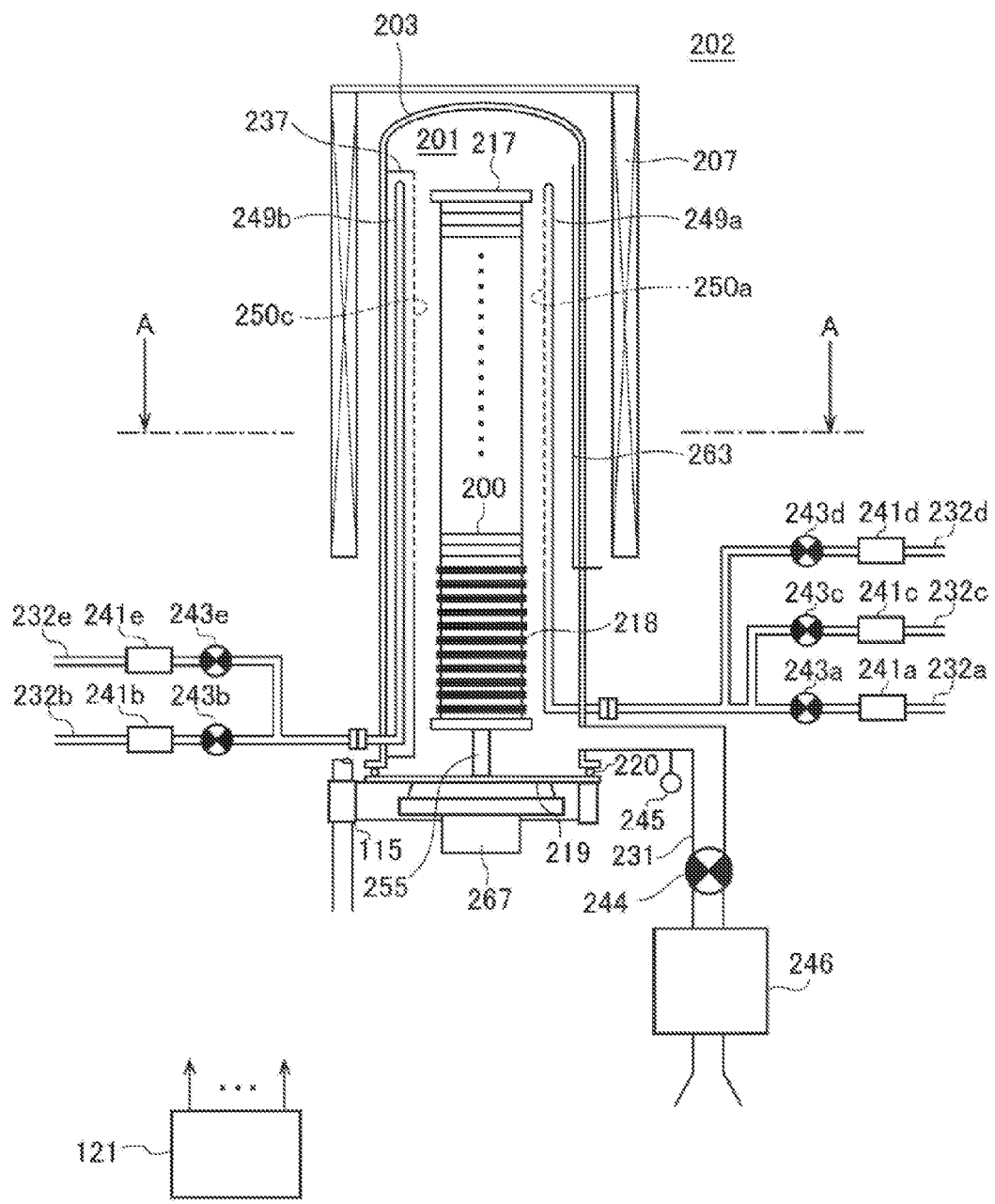
FIG. 1 is a schematic configuration diagram of a vertical process furnace of a substrate processing apparatus suitably used in an embodiment of the present invention and a longitudinal sectional view of a process furnace part.

As illustrated in FIG. 1, a process furnace 202 includes a heater 207 serving as a heating unit (heating mechanism). The heater 207 has a cylindrical shape and is vertically installed by being supported to a heater base (not illustrated) serving as a holding plate. As described later, the heater 207 functions as an activation mechanism (excitation unit) that activates (excites) gas by heat.

In the heater 207, a reaction tube 203 is disposed to constitute a reaction vessel (process vessel) concentrically with the heater 207. The reaction tube 203 is made of a heat resistant material, such as quartz ($SiO_2$) or silicon carbide (SiC), and is formed to have a cylindrical shape with a closed upper end and an opened lower end. A process chamber 201 is formed in a cylindrical hollow part of the reaction tube 203. The process chamber 201 is configured such that wafers 200 as substrates can be accommodated in a state of being aligned vertically in a horizontal posture and in multiple stages by a boat 217 to be described below.

In the process chamber 201, a nozzle 249a serving as a first nozzle and a nozzle 249b serving as a second nozzle are provided to pass through a lower sidewall of the reaction tube 203. The nozzle 249a and the nozzle 249b are made of, for example, a heat resistant material such as quartz or SiC. Gas supply pipes 232a and 232b are connected to the nozzles 249a and 249b, respectively. A gas supply pipe 232c is connected to the gas supply pipe 232a. As such, the two nozzles 249a and 249b and the three gas supply pipes 232a to 232c are provided in the reaction tube 203 and are configured such that a plurality of types of gases can be supplied into the process chamber 201.

However, the process furnace 202 according to the present embodiment is not limited to the above form. For example, a metal manifold configured to support the reaction tube 203 may be provided in the lower part of the reaction tube 203, and each nozzle may be provided to pass through a sidewall of the manifold. Inn this case, an exhaust pipe 231 to be described below may be further provided in the manifold. In this case as well, the exhaust pipe 231 may be provided not in the manifold but in the lower part of the reaction tube 203. Thus, a furnace throat part of the process furnace 202 may be made of a metal, and nozzles or the like may be attached to the metal furnace throat part.

Mass flow controllers (MFCs) 241a to 241c being flow rate controllers (flow rate control units) and valves 243a to 243c being on-off valves are respectively provided in the gas supply pipes 232a to 232c sequentially from an upstream direction. Gas supply pipes 232d and 232e configured to supply an inert gas are respectively connected to downstream sides of the valves 243a and 243b of the gas supply pipes 232a and 232b. MFCs 241d and 241e being flow rate controllers (flow rate control units) and valves 243d and 243e being on-off valves are respectively provided in the gas supply pipes 232d and 232e sequentially from the upstream direction.

The nozzle 249a is connected to a tip end part of the gas supply pipe 232a. As illustrated in FIG. 2, the nozzle 249a is provided in an annular space between an inner wall of the reaction tube 203 and the wafers 200, so as to rise upward in an arranging direction of the wafers 200, extending from a lower part to an upper part of the inner wall of the reaction tube 203. That is, the nozzle 249a is provided in a region horizontally surrounding a wafer arrangement region, at a side of the wafer arrangement region in which the wafers 200 are arranged, so as to extend along the wafer arrangement region. In other words, the nozzle 249a is provided vertically to a surface (flat surface) of the wafer 200 at a side of an edge (periphery) of the wafer 200 loaded into the process chamber 201. The nozzle 249a is formed as an L-shaped long nozzle, of which a horizontal portion is provided so as to pass through a lower sidewall of the reaction tube 203 and of which a vertical portion is provided so as to rise at least from one end side toward the other end side of the wafer arrangement region. A gas supply hole 250a configured to supply gas is formed on a side surface of the nozzle 249a. The gas supply hole 250a is opened to face the center of the reaction tube 203, so that the gas can be supplied toward the wafer 200. The gas supply hole 250a is plurally provided to extend from the lower part to the upper part of the reaction tube 203, such that the gas supply holes 250a have the same opening area and are provided at the same opening pitch.

The nozzle 249b is connected to a tip end part of the gas supply pipe 232b. The nozzle 249b is provided in a buffer chamber 237. The buffer chamber 237 functions as a gas distribution space. The buffer chamber 237 is provided in an annular space between the inner wall of the reaction tube 203 and the wafers 200 in an arranging direction of the wafers 200 so as to extend from the lower part to the upper part of the inner wall of the reaction tube 203. That is, the buffer chamber 237 is provided in a region horizontally surrounding the wafer arrangement region, at the side of the wafer arrangement region, so as to extend along the wafer arrangement region. In other words, the buffer chamber 237 is provided at the side of the edge of the wafer 200 loaded into the process chamber 201. A gas supply hole 250c configured to supply gas is provided at an end part of a wall of the buffer chamber 237 adjacent to the wafer 200. The gas supply hole 250c is opened toward to face the center of the reaction tube 203, so that the gas can be supplied toward the wafer 200. The gas supply hole 250c is plurally provided to extend from the lower part to the upper part of the reaction tube 203, such that the gas supply holes 250c have the same opening area and are provided at the same opening pitch.

The nozzle 249b is provided at the end part of the buffer chamber 237 opposed to the end part where the gas supply holes 250c are provided, so as to rise upward in the arranging direction of the wafers 200, extending from the lower part to the upper part of the inner wall of the reaction tube 203. That is, the nozzle 249b is provided in a region horizontally surrounding a wafer arrangement region, at a side of the wafer arrangement region in which the wafers 200 are arranged, so as to extend along the wafer arrangement region. In other words, the nozzle 249b is provided vertically to the surface of the wafer 200 at the side of the edge of the wafer 200 loaded into the process chamber 201. The nozzle 249b is formed as an L-shaped long nozzle, of which a horizontal portion is provided so as to pass through a lower sidewall of the reaction tube 203 and of which a vertical portion is provided so as to rise at least from one end side toward the other end side of the wafer arrangement region. A gas supply hole 250b configured to supply gas is provided on a side surface of the nozzle 249b. The gas supply hole 250b is opened to face the center of the buffer chamber 237. Similar to the gas supply holes 250c, the gas supply hole 250b is plurally provided from the lower part to the upper part of the reaction tube 203. When a pressure difference between the buffer chamber 237 and the process chamber 201 is small, the opening areas and the opening pitches of the plurality of gas supply holes 250b may be made equal to each other from the upstream side (lower part) to the downstream side (upper part). In addition, when the pressure difference between the buffer chamber 237 and the process chamber 201 is large, the opening areas of the gas supply holes 250b may be gradually increased from the upstream side toward the downstream side, and the opening pitches of the gas supply holes 250b may be gradually decreased from the upstream side toward the downstream side.

Although there is a difference in a flow velocity, a certain gas can be ejected at a substantially equal flow rate from each of the gas supply holes 250b by controlling the opening area or the opening pitch of each of the gas supply holes 250b from the upstream side to the downstream side as described above. It is possible to perform uniformizing of the difference in the gas flow velocity in the buffer chamber 237 by introducing the gas ejected from each of the plurality of gas supply holes 250b into the buffer chamber 237. The gas ejected from each of the plurality of gas supply holes 250b into the buffer chamber 237 is ejected from the plurality of gas supply holes 250c into the process chamber 201 after the particle velocity of each gas is relaxed in the buffer chamber 237. The gas ejected from each of the plurality of gas supply holes 250b into the buffer chamber 237 becomes gas having a uniform flow rate and a uniform flow velocity when the gas is ejected from each of the gas supply holes 250c into the process chamber 201.

As such, in the present embodiment, the gas is carried through the nozzles 249a and 249b and the buffer chamber 237 disposed in the annular elongated space, i.e., the cylindrical space, which is defined by the inner wall of the sidewall of the reaction tube 203 and the ends (peripheries) of the plurality of wafers 200 arranged in the reaction tube 203. The gas is ejected from the gas supply holes 250a to 250c, which are respectively opened in the nozzles 249a and 249b and the buffer chamber 237, to the reaction tube 203 for the first time in the vicinity of the wafer 200. A main flow of gas in the reaction tube 203 is a direction parallel to the surface of the wafer 200, i.e., a horizontal direction. Due to such a configuration, it is possible to uniformly supply the gas to each of the wafers 200 and to improve the film thickness uniformity of a thin film formed in each of the wafers 200. Gas flowing on the surface of the wafer 200, i.e., gas remaining after reaction, flows in a direction of an exhaust port, i.e., the exhaust pipe 231 to be described below. However, the direction of the flow of the remaining gas is appropriately specified according to the position of the exhaust port and is not limited to a vertical direction.

As borazine-based gas including a ligand, for example, gas including an organic ligand and a borazine ring structure, i.e., organic borazine-based gas, is supplied from the gas supply pipe 232a into the process chamber 201 through the MFC 241a, the valve 243a, and the nozzle 249a.

As the organic borazine-based gas, for example, gas obtained by vaporizing an alkylborazine compound being an organic borazine compound may be used. The organic borazine-based gas may also be referred to as a borazine compound gas or a borazine-based gas.

Figure 10A:
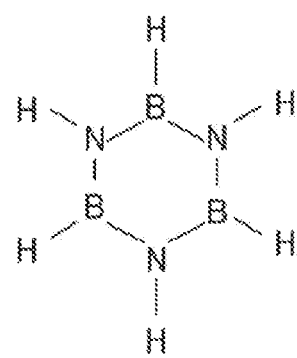
FIG. 10A is a diagram illustrating a chemical structural formula of borazine.
Figure 10B:
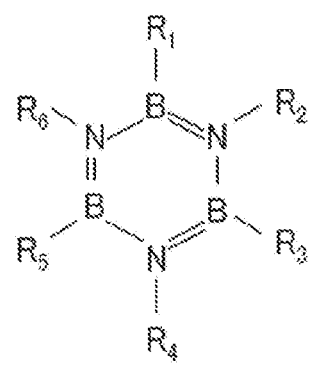
FIG. 10B is a diagram illustrating a chemical structural formula of a borazine compound.

Here, the borazine is a heterocyclic compound composed of three elements of B, N, and H and may be expressed by a composition formula of $B_3H_6N_3$, and may be expressed by a chemical structural formula illustrated in FIG. 10A. The borazine compound is a compound including a borazine ring structure (also referred to as a borazine structure) constituting a borazine ring composed of three boron (B) atoms and three nitrogen (N) atoms. The organic borazine compound is a carbon-containing borazine compound and may also be said to be a borazine compound containing a carbon-containing ligand, i.e., an organic ligand. The alkylborazine compound is a borazine compound containing an alkyl group and may also be said to be a borazine compound containing an alkyl group as an organic ligand. The alkylborazine compound is obtained by substituting at least one of six hydrogen (H) atoms contained in borazine with hydrocarbon containing one or more carbon (C) atoms and may be expressed by a chemical structural formula illustrated in FIG. 10B. Here, each of $R_1$ to $R_6$ in the chemical structural formula illustrated in FIG. 10B is a hydrogen (H) atom or an alkyl group containing 1 to 4 carbon (C) atoms. $R_1$ to $R_6$ may be the same kind of alkyl group or may be different kinds of alkyl groups. However, $R_1$ to $R_6$ exclude a case where each of $R_1$ to $R_6$ is a hydrogen (H) atom. The alkylborazine compound may also be said to be a material that has a borazine ring structure constituting a borazine ring and contains boron (B), nitrogen (N), hydrogen (H), and carbon (C). In addition, the alkyl borazine compound may also be said to be a material that includes a borazine ring structure and includes an alkyl ligand. Each of $R_1$ to $R_6$ may be a hydrogen (H) atom or may be an alkenyl group or an alkynyl group containing 1 to 4 carbon (C) atoms. $R_1$ to $R_6$ may be the same kind of alkenyl group or alkynyl group or may be different kinds of alkenyl groups or alkynyl groups. However, $R_1$ to $R_6$ exclude a case where each of $R_1$ to $R_6$ is a hydrogen (H) atom.

In a substrate processing process to be described below, the borazine-based gas acts as a B source and also acts as an N source and a C source.

Figure 10C:
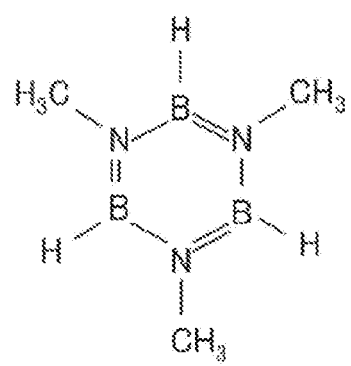
FIG. 10C is a diagram illustrating a chemical structural formula of n,n',n"-trimethyl borazine.
Figure 10D:
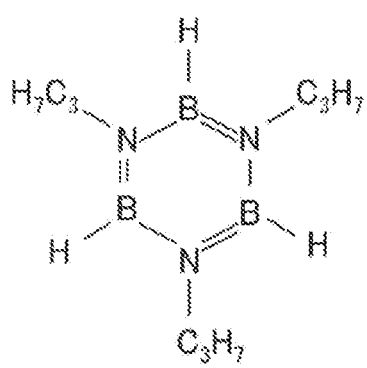
FIG. 10D is a diagram illustrating a chemical structural formula of n,n',n"-tri-n-propyl borazine.

As the borazine-based gas, for example, n,n',n"-trimethylborazine (abbreviated as TMB) gas, n,n',n"-triethylborazine (abbreviated as TEB) gas, n,n',n"-tri-n-propylborazine (abbreviated as TPB) gas, n,n',n"-triisopropylborazine (abbreviated as TIPB) gas, n,n',n"-tri-n-butylborazine (abbreviated as TBB) gas, or n,n',n"-triisobutylborazine (abbreviated as TIBB) gas may be used. TMB is a borazine compound in which each of $R_1$, $R_3$, and $R_5$ is hydrogen (H) and each of $R_2$, $R_4$, and $R_6$ is a methyl group in the chemical structural formula illustrated in FIG. 10B and may be expressed by a chemical structural formula illustrated in FIG. 10C. TEB is a borazine compound in which each of $R_1$, $R_3$, and $R_5$ is hydrogen (H) and each of $R_2$, $R_4$, and $R_6$ is an ethyl group in the chemical structural formula illustrated in FIG. 10B. TPB is a borazine compound in which each of $R_1$, $R_3$, and $R_5$ is hydrogen (H) and each of $R_2$, $R_4$, and $R_6$ is a propyl group in the chemical structural formula illustrated in FIG. 10B and may be expressed by a chemical structural formula illustrated in FIG. 10D. TIPB is a borazine compound in which each of $R_1$, $R_3$, and $R_5$ is hydrogen (H) and each of $R_2$, $R_4$, and $R_6$ is an isopropyl group in the chemical structural formula illustrated in FIG. 10B. TBB is a borazine compound in which each of $R_1$, $R_3$, and $R_5$ is hydrogen (H) and each of $R_2$, $R_4$, and $R_6$ is a butyl group in the chemical structural formula illustrated in FIG. 10B. TIBB is a borazine compound in which each of $R_1$, $R_3$, and $R_5$ is hydrogen (H) and each of $R_2$, $R_4$, and $R_6$ is an isobutyl group in the chemical structural formula illustrated in FIG. 10B.

In the case of using the borazine compound, such as TMB, which is in a liquid state under normal temperature and normal pressure, the borazine compound that is in the liquid state is vaporized by a vaporization system, such as a vaporizer or a bubbler, and is supplied as the borazine-based gas (TMB gas or the like).

In addition, as the gas having a different chemical structure (molecular structure) from the above-described borazine-based gas, for example, a boron-containing gas having no borazine ring structure is supplied from the gas supply pipe 232a into the process chamber 201 through the MFC 241a, the valve 243a, and the nozzle 249a. As the boron-containing gas having no borazine ring structure, for example, a borane-based gas may be used.

The borane-based gas is a borane compound of a gas state, for example, a gas obtained by vaporizing a borane compound that is in a liquid state under normal temperature and normal pressure, or a borane compound that is in a gas state under normal temperature and normal pressure. The borane compound includes a haloborane compound containing boron (B) and a halogen element, for example, a chloroborane compound containing boron (B) and chlorine (Cl). In addition, the borane compound includes a borane (borohydride) such as monoborane ($BH_3$) and diborane ($B_2H_6$), or a borane compound (borane derivative) in which a hydrogen (H) atom of a borane is substituted with another element or the like. The borane-based gas acts as a boron source in a substrate processing process to be described below. As the borane-based gas, for example, trichloroborane gas ($BCl_3$) may be used. The $BCl_3$ gas is a boron-containing gas not having the above-described borazine compound, i.e., a non-borazine-based boron-containing gas.

In addition, as a ligand desorption gas that desorbs a ligand (organic ligand) from the above-described borazine-based gas (organic borazine-based gas), for example, a nitrogen-containing gas is supplied from the gas supply pipe 232b into the process chamber 201 through the MFC 241b, the valve 243b, the nozzle 249b, and the buffer chamber 237. Since the ligand desorption gas acts to break a connection (chemical bond) of the borazine ring structure and the ligand contained in the borazine-based gas as described later, the ligand desorption gas may also be referred to as a ligand breaking gas. In addition, although the ligand desorption gas does not basically act as a source gas by itself in a substrate processing process to be described below, the ligand desorption gas acts to accelerate the progress of a film forming process on a wafer 200 by using the above-described source gas. Hence, the ligand desorption gas may also be referred to as a film forming accelerating gas. As the nitrogen-containing gas, for example, a nitrogen hydride-based gas consisting of two elements, i.e., nitrogen (N) and hydrogen (H), may be used. As the nitrogen hydride-based gas, for example, ammonia ($NH_3$) gas may be used. The nitrogen-containing gas may act as a nitrogen source according to a process condition.

In addition, as the gas having a different chemical structure from the borazine-based gas, the boron-containing gas, and the ligand desorption gas, for example, a carbon-containing gas is supplied from the gas supply pipe 232c into the process chamber 201 through the MFC 241c, the valve 243c, the gas supply pipe 232a, and the nozzle 249a. As the carbon-containing gas, for example, a hydrocarbon-based gas may be used. Although the hydrocarbon-based gas is a material consisting of two elements, i.e., carbon (C) and hydrogen (H), the hydrocarbon-based gas acts as a carbon source in a substrate processing process to be described below. As the hydrocarbon-based gas, for example, propylene ($C_3H_6$) gas may be used.

As the inert gas, for example, nitrogen ($N_2$) gas is supplied from the gas supply pipes 232d and 232e into the process chamber 201 through the MFCs 241d and 241e, the valves 243d and 243e, the gas supply pipes 232a and 232b, the nozzles 249a and 249b, and the buffer chamber 237.

In a case where the above-described borazine-based gas is supplied from the gas supply pipe 232a, a borazine-based gas supply system mainly includes the gas supply pipe 232a, the MFC 241a, and the valve 243a. The borazine-based gas supply system may further include the nozzle 249a. The borazine-based gas supply system may also be referred to as a borazine compound supply system. In a case where the organic borazine-based gas is supplied from the gas supply pipe 232a, the borazine-based gas supply system may also be referred to as an organic borazine-based gas supply system or an organic borazine compound supply system.

In a case where the above-described boron-containing gas is supplied from the gas supply pipe 232a, a boron-containing gas supply system mainly includes the gas supply pipe 232a, the MFC 241a, and the valve 243a. The boron-containing gas supply system may further include the nozzle 249a. In a case where the borane-based gas is supplied as the boron-containing gas from the gas supply pipe 232a, the boron-containing gas supply system may also be referred to as a borane-based gas supply system or a borane compound supply system.

In a case where the above-described ligand desorption gas is supplied from the gas supply pipe 232b, a ligand desorption gas supply system mainly includes the gas supply pipe 232b, the MFC 241b, and the valve 243b. The ligand desorption gas supply system may further include the nozzle 249b and the buffer chamber 237. The ligand desorption gas supply system may also be referred to as a film forming accelerating gas supply system. In a case where the nitrogen-containing gas is supplied as the ligand desorption gas, the ligand desorption gas supply system may also be referred to as a nitrogen-containing gas supply system. In addition, in a case where the nitrogen hydride gas is supplied as the ligand desorption gas, the ligand desorption gas supply system may also be referred to as a nitrogen hydride-based gas supply system or a nitrogen hydride supply system.

In a case where the above-described carbon-containing gas is supplied from the gas supply pipe 232c, a carbon-containing gas supply system mainly includes the gas supply pipe 232c, the MFC 241c, and the valve 243c. The carbon-containing gas supply system may further include the gas supply pipe 232a and the nozzle 249a. In a case where the hydrocarbon-based gas is supplied from the gas supply pipe 232c, the carbon-containing gas supply system may also be referred to as a hydrocarbon gas supply system or a hydrocarbon supply system.

One or all of the borazine-based gas, the boron-containing gas, and the carbon-containing gas may also be referred to as a source gas or a source. In addition, these gases may be collectively referred to as a film-forming gas. One or all of the borazine-based gas supply system, the boron-containing gas supply system, and the carbon-containing gas supply system may also be referred to as a source gas supply system or a source supply system. In addition, these gas supply systems may be collectively referred to as a film-forming gas supply system. Although the ligand desorption gas does not basically act as a source gas by itself as described above, the ligand desorption gas acts to accelerate the progress of the film forming process using the source gas and also acts as a nitrogen source in the nitrogen-containing gas. Hence, the ligand desorption gas may be included in a film-forming gas (source gas). Therefore, the ligand desorption gas supply system may be included in the film-forming gas supply system (source gas supply system).

In addition, an inert gas supply system mainly includes the gas supply pipes 232d and 232e, the MFCs 241d and 241e, and the valves 243d and 243e. The inert gas supply system may also be referred to as a purge gas supply system, a dilution gas supply system, or a carrier gas supply system.

Figure 2:
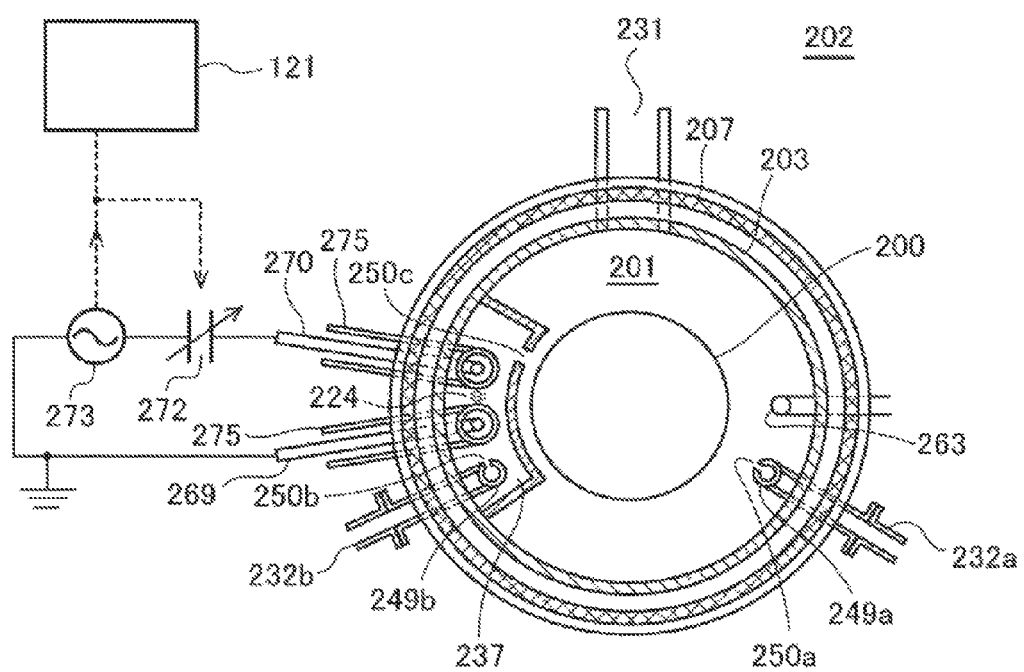
FIG. 2 is a schematic configuration diagram of a portion of the vertical process furnace of the substrate processing apparatus suitably used in the embodiment of the present invention and a sectional view of a portion of the process furnace, taken along line A-A of FIG. 1.

In the buffer chamber 237, as illustrated in FIG. 2, two rod-shaped electrodes 269 and 270, each of which is made of a conductor and has an elongated structure, are disposed from the lower side to the upper side of the reaction tube 203 in a direction in which the wafers 200 are stacked. Each of the rod-shaped electrodes 269 and 270 is provided in parallel to the nozzle 249b. Each of the rod-shaped electrodes 269 and 270 is covered with and protected by an electrode protection pipe 275 from the upper side to the lower side thereof. One of the rod-shaped electrodes 269 and 270 is connected to a radio-frequency (RF) power source 273 through a matcher 272, and the other thereof is connected to an earth which is a reference potential. By supplying RF power from the RF power source 273 through the matcher 272 between the rod-shaped electrodes 269 and 270, plasma is generated in a plasma generation region 224 between the rod-shaped electrodes 269 and 270. A plasma source serving as a plasma generator (plasma generation unit) mainly includes the rod-shaped electrodes 269 and 270 and the electrode protection pipes 275. The plasma source may further include the matcher 272 and the RF power source 273. The plasma source functions as an excitation unit (activation mechanism) configured to excite (activate) gas to generate plasma, i.e., to excite (activate) gas to a plasma state as described below.

The electrode protection pipe 275 is configured such that each of the rod-shaped electrodes 269 and 270 may be inserted into the buffer chamber 237 in a state of being isolated from an atmosphere of the buffer chamber 237. When an oxygen (O) concentration in the electrode protection pipe 275 is approximately equal to an oxygen concentration in the outside air (atmosphere), the rod-shaped electrodes 269 and 270 respectively inserted into the electrode protection pipes 275 are oxidized by heat generated by the heater 207. The insides of the electrode protection pipes 275 are filled with an inert gas, such as $N_2$ gas, or are purged with an inert gas, such as $N_2$ gas, by using an inert gas purge mechanism so that the oxygen concentration in the insides of the electrode protection pipes 275 may be reduced to prevent the oxidation of the rod-shaped electrodes 269 and 270.

An exhaust pipe 231 is provided in the reaction tube 203 to exhaust the atmosphere of the process chamber 201. A vacuum pump 246 serving as a vacuum exhaust device is connected to the exhaust pipe 231 through a pressure sensor 245 serving as a pressure detector (pressure detection unit) configured to detect a pressure in the process chamber 201 and an auto pressure controller (APC) valve 244 serving as a pressure regulator (pressure regulation unit). The APC valve 244 is a valve configured to perform a vacuum exhaust or a vacuum exhaust stop to the process chamber 201 by opening/closing the valve while the vacuum pump 246 is operated, and to regulate the pressure in the process chamber 201 by controlling the degree of valve opening based on pressure information detected by the pressure sensor 245 while the vacuum pump 246 is operated. A vacuum system mainly includes the exhaust pipe 231, the APC valve 244, and the pressure sensor 245. The exhaust system may further include the vacuum pump 246.

Below the reaction tube 203, a seal cap 219 is provided as a furnace throat lid that can airtightly close a lower end opening of the reaction tube 203. The seal cap 219 is configured to be brought into contact with a lower end of the reaction tube 203 from a lower side in a vertical direction. The seal cap 219 is made of a metal such as stainless steel (SUS) and is formed to have a disk shape. An O-ring 220 serving as a seal member that comes into contact with the lower end of the reaction tube 203 is provided on the top surface of the seal cap 219. A rotating mechanism 267 that rotates the boat 217 to be described below is installed at a side of the seal cap 219 opposite to the process chamber 201. A rotational shaft 255 of the rotating mechanism 267 is connected to the boat 217 while passing through the seal cap 219. The rotating mechanism 267 is configured to rotate the wafers 200 by rotating the boat 217. The seal cap 219 is configured to be vertically moved by a boat elevator 115 serving as an elevating mechanism that is vertically installed outside the reaction tube 203. The boat elevator 115 is configured to load the boat 217 into the process chamber 201 or unload the boat 217 from the process chamber 201 by moving the seal cap 219 upward or downward. That is, the boat elevator 115 is configured as a transfer device (transfer mechanism) that transfers the boat 217, i.e., the wafers 200, to the inside or the outside of the process chamber 201.

The boat 217 serving as a substrate supporter is configured such that a plurality of wafers, for example, 25 to 200 wafers 200, are vertically aligned and supported in a horizontal posture, with their centers aligned with one another, in multiple stages, i.e., arranged spaced apart from one another. The boat 217 is made of, for example, a heat resistant material such as quartz or SiC. Below the boat 217, a heat insulation plate 218 made of, for example, a heat resistant material such as quartz or SiC, is configured to be supported in a horizontal posture in multiple stages. Due to this configuration, heat generated from the heater 207 is hardly transmitted to the seal cap 219 side. However, the present embodiment is not limited to the above example. For example, instead of providing the heat insulation plate 218 below the boat 217, a heat insulation cylinder configured as a cylindrical member made of a heat resistant material such as quart or SiC may be provided.

A temperature sensor 263 serving as a temperature detector is installed in the reaction tube 203. An amount of current to be supplied to the heater 207 is regulated based on temperature information detected by the temperature sensor 263, so that the temperature in the process chamber 201 has a desired temperature distribution. The temperature sensor 263 is configured to have an L shape similar to the nozzles 249a and 249b and is provided along the inner wall of the reaction tube 203.

Figure 3:
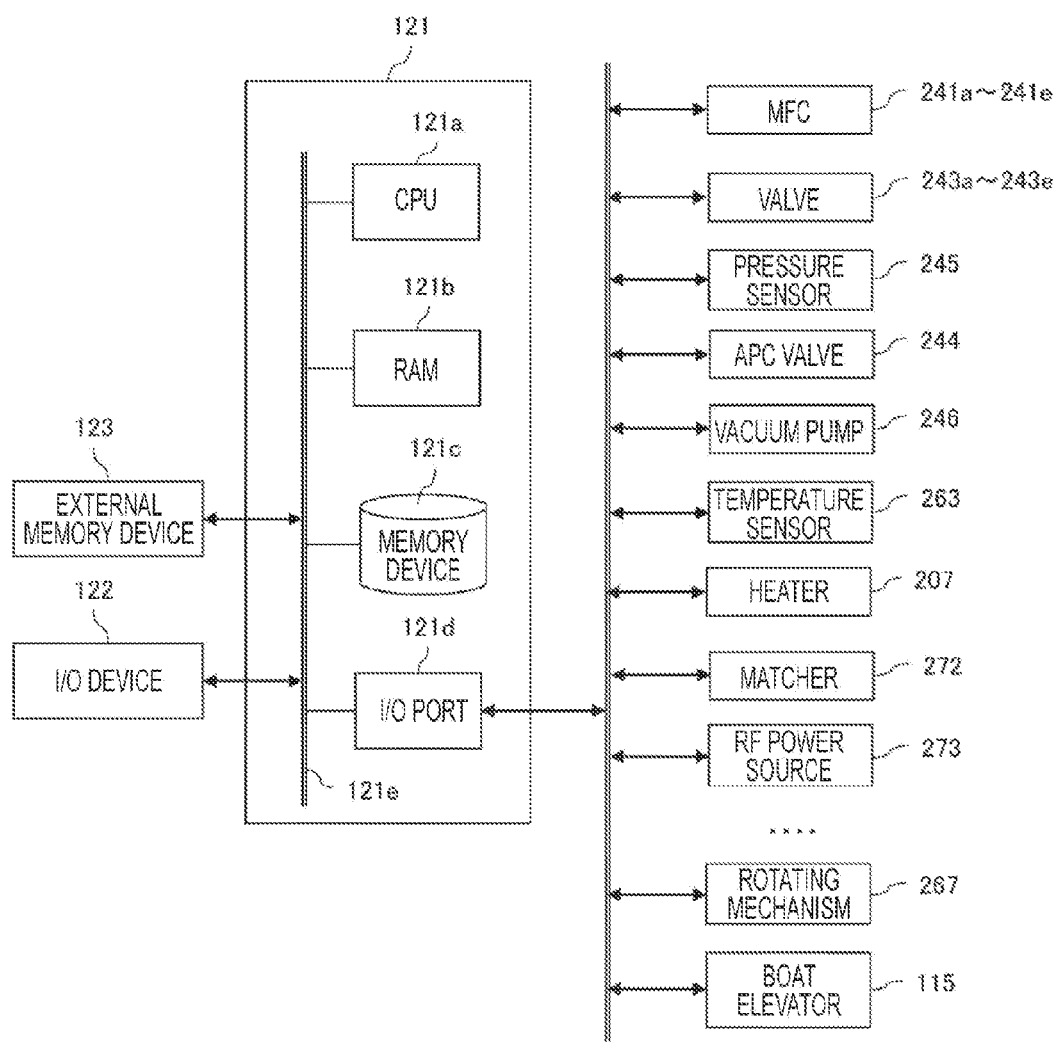
FIG. 3 is a schematic configuration diagram of a controller of the substrate processing apparatus suitably used in the embodiment of the present invention and a block diagram of a control system of the controller.

As illustrated in FIG. 3, a controller 121 which is a control unit (control device) is configured as a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122 configured as, for example, a touch panel or the like, is connected to the controller 121.

The memory device 121c includes, for example, a flash memory, a hard disk drive (HDD), or the like. In the memory device 121c, a control program for controlling an operation of a substrate processing apparatus or a process recipe including a sequence or conditions of substrate processing which will be described below is stored to be readable. The process recipe is a combination of sequences of a substrate processing process which will be described below to obtain a desired result when the sequences are performed by the controller 121, and functions as a program. Hereinafter, the process recipe, the control program, and the like will be simply and collectively referred to as a program. When the term "program" is used in the present disclosure, it may be understood as including only a process recipe, only a control program, or both of the process recipe and the control program. The RAM 121b is configured as a memory area (work area) in which a program or data read by the CPU 121a is temporarily retained.

The I/O port 121d is connected to the MFCs 241a to 241e, the valves 243a to 243e, the pressure sensor 245, the APC valve 244, the vacuum pump 246, the heater 207, the temperature sensor 263, the RF power source 273, the matcher 272, the rotating mechanism 267, and the boat elevator 115.

The CPU 121a is configured to read and execute the control program from the memory device 121c and to read the process recipe from the memory device 121c according to an operation command received from the I/O device 122. According to the read process recipe, the CPU 121a is configured to control the operation of regulating the flow rates of various gases by using the MFCs 241a to 241e, the operation of opening/closing the valves 243a to 243e, the operation of opening/closing the APC valve 244, the operation of regulating the pressure by using the APC valve 244 based on the pressure sensor 245, the operation of driving and suspending the vacuum pump 246, the operation of regulating the temperature of the heater 207 based on the temperature sensor 263, the operation of supplying power by using the RF power source 273, the operation of regulating impedance by using the matcher 272, the operation of controlling the rotation and rotating speed of the boat 217 by using the rotating mechanism 267, the operation of moving the boat 217 upward or downward by using the boat elevator 115, and the like.

The controller 121 is not limited to a dedicated computer and may be configured as a general-purpose computer. For example, the controller 121 according to the present embodiment may be configured by preparing an external memory device 123 storing the above-described program (e.g., a magnetic disk (a magnetic tape, a flexible disk, a hard disk, etc.), an optical disk (a compact disc (CD), a digital versatile disc (DVD), etc.), a magneto-optical (MO) disc, or a semiconductor memory (a universal serial bus (USB) memory, a memory card, etc.), and then installing the program on a general-purpose computer by using the external memory device 123. However, a device for providing the program to the computer is not limited to the use of the external memory device 123. For example, the program may be provided without using the external memory device 123 by using a communication unit such as the Internet or a private line. The memory device 121c or the external memory device 123 is configured as a non-transitory computer-readable recording medium. Hereinafter, the memory device 121c and the external memory device 123 may also be simply and collectively referred to as a recording medium. When the term "recording medium" is used in the present disclosure, it may be understood as including only the memory device 121c, only the external memory device 123, or both of the memory device 121c and the external memory device 123.

(2) Substrate Processing Process

An example of a sequence of forming a film on a substrate by using the above-described substrate processing apparatus will be described with reference to FIG. 4 as one of processes of manufacturing a semiconductor device (device). In the following description, operations of the respective elements constituting the substrate processing apparatus are controlled by the controller 121.

Figure 4:
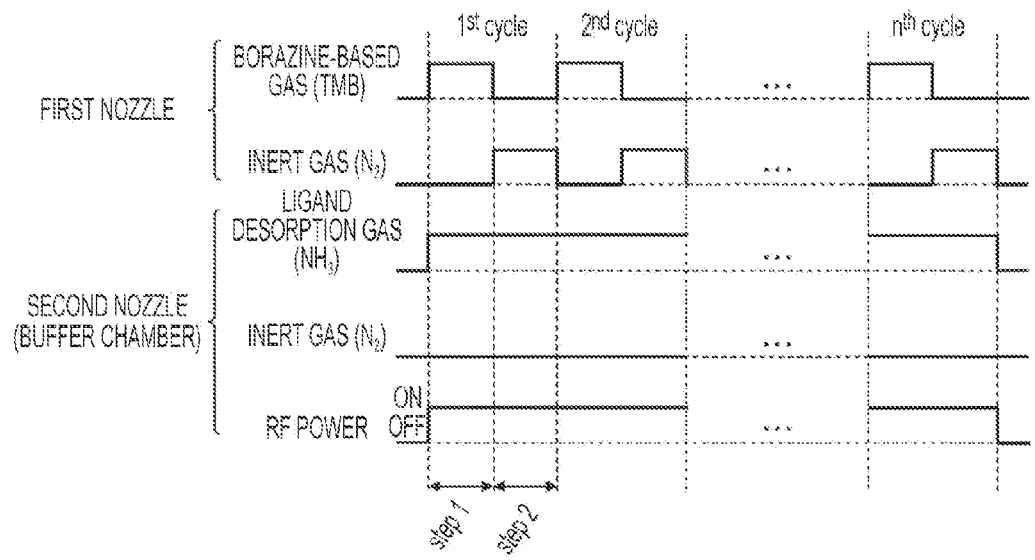
FIG. 4 is a diagram illustrating a gas supply timing in a film forming sequence according to an embodiment of the present invention.

In a film forming sequence illustrated in FIG. 4, a boron nitride film (BN film) including a borazine ring structure or a boron carbon nitride film (BCN film) including a borazine ring structure is formed on a wafer 200 as a film having a borazine ring structure and containing boron (B) and nitrogen (N) by intermittently performing an act of simultaneously performing: (a) supplying TMB gas as a borazine-based gas including a ligand to the wafer 200 as a substrate; (b) supplying $NH_3$ gas as a ligand desorption gas which desorbs the ligand to the wafer 200, wherein the (a) and (b) are performed under a condition where the borazine ring structure in the TMB gas is maintained. In the following description, the BN film including the borazine ring structure and the BCN film including the borazine ring structure may also be referred to as a BN film and a BCN film, respectively.

When the BN film (or the BCN film) is formed, step (period) of stopping the supply of at least one of the TMB gas and the $NH_3$ gas may be included during the film forming process. In the film forming sequence illustrated in FIG. 4, an example of intermittently supplying the TMB gas while continuously supplying the $NH_3$ gas is illustrated. In addition, in the film forming sequence illustrated in FIG. 4, an example of exciting the $NH_3$ gas to a plasma state and supplying the $NH_3$ gas to the wafer 200 is illustrated.

In the present disclosure, for convenience, the above-described film forming sequence may be represented as follows.

(Continuous Supply of $NH_3$*)+(Intermittent Supply of TMB) ⇒ BN film or BCN film When the term "wafer" is used in the present disclosure, it may be understood as "a wafer itself" or "a stacked structure (assembly) of a wafer and a specific film or layer formed on a surface of the wafer, i.e., a wafer including a specific layer or film formed on a surface of the wafer". In addition, when the expression "surface of the wafer" is used in the present disclosure, it may be understood as "a surface (exposed surface) of the wafer itself" or "a surface of a specific layer or film formed on the wafer, i.e., an uppermost surface of the wafer as a stacked structure".

Thus, in the present disclosure, the expression "a specific gas is supplied to a wafer" may be understood to mean that "the specific gas is directly supplied to a surface (exposed surface) of the wafer itself" or mean that "the specific gas is supplied to a layer or film formed on the wafer, i.e., an uppermost surface of the wafer as a stacked structure". In addition, in the present disclosure, the expression "a specific layer (or film) is formed on a wafer" may be understood to mean that "a specific layer (or film) is directly formed on a surface (exposed surface) of the wafer itself" or mean that "a specific layer (or film) is formed on a layer or film formed on the wafer, i.e., an uppermost surface of the wafer as a stacked structure".

In addition, the term "substrate" used in the present disclosure has the same meaning as the term "wafer". In this case, in the above description, the term "wafer" may be used interchangeably with the term "substrate".

(Wafer Charging and Boat Loading)

A plurality of wafers 200 are charged in the boat 217 (wafer charging). After that, as illustrated in FIG. 1, the boat 217 supporting the plurality of wafers 200 is lifted by the boat elevator 115 and is loaded into the process chamber 201 (boat loading). In this state, the seal cap 219 is in a state of sealing the lower end of the reaction tube 203 through the 0-ring 220.

(Pressure Regulation and Temperature Regulation)

The inside of the process chamber 201, i.e., the space where the wafers 200 are present, is vacuum-exhausted (decompression exhaust) to have a desired pressure (degree of vacuum) by the vacuum pump 246. In this case, the pressure in the process chamber 201 is measured by the pressure sensor 245, and the APC valve 244 is feedback-controlled based on information on the measured pressure. The vacuum pump 246 is kept operated at least until the processing on the wafers 200 is completed. In addition, the wafer in the process chamber 201 is heated by the heater 207 until the wafer 200 has a desired temperature. In this case, an amount of current supplied to the heater 207 is feedback-controlled based on temperature information detected by the temperature sensor 263, so that the inside of the process chamber 201 has a desired temperature distribution. The heating of the inside of the process chamber 201 by the heater 207 is continuously performed at least until the processing on the wafers 200 is completed. In addition, the rotation of the boat 217 and the wafers 200 is started by the rotating mechanism 267. The rotation of the boat 217 and the wafers 200 by the rotating mechanism 267 is continuously performed at least until the processing on the wafers 200 is completed.

(Film Forming Process)

After that, the following two steps, i.e., steps 1 and 2, are sequentially performed.

[Step 1]

In this step, the TMB gas and the plasma-excited $NH_3$ gas are simultaneously supplied to the wafer 200 in the process chamber 201.

Here, the valve 243a is opened to supply the TMB gas into the gas supply pipe 232a. The TMB gas, the flow rate of which is controlled by the MFC 241a, is supplied into the process chamber 201 through the nozzle 249a and is exhausted from the exhaust pipe 231. At the same time, the valve 243b is opened to supply the $NH_3$ gas into the gas supply pipe 232b. The $NH_3$ gas, the flow rate of which is controlled by the MFC 241b, is supplied into the buffer chamber 237 through the nozzle 249b. In addition, RF power is supplied between the rod-shaped electrodes 269 and 270, and the $NH_3$ gas supplied into the buffer chamber 237 is plasma-excited. The plasma-excited NH₃ gas is supplied from the buffer chamber 237 to the process chamber 201 and is exhausted from the exhaust pipe 231. At this time, the TMB gas and the plasma-excited NH₃ gas are simultaneously supplied to the wafer 200.

The supply flow rate of the TMB gas, which is controlled by the MFC 241a, is set to be within, for example, a range of 1 to 1,000 sccm. The supply flow rate of the NH₃ gas, which is controlled by the MFC 241b, is set to be within, for example, a range of 100 to 10,000 sccm. The RF power, which is applied between the rod-shaped electrodes 269 and 270, is set to be within, for example, a range of 50 to 1,000 W. The pressure in the process chamber 201 is set to be within, for example, a range of 1 to 2,666 Pa, and preferably a range of 67 to 1,333 Pa. A time for which the TMB gas and the NH₃ gas are supplied to the wafer 200, i.e., a gas supply time (irradiation time), is set to be within, for example, a range of 1 to 180 seconds, preferably a range of 1 to 120 seconds, and more preferably a range of 1 to 60 seconds. The temperature of the heater 207 is set such that the temperature of the wafer 200 is set to be within, for example, a range of 100 to 700° C., preferably 100 to 600° C., and more preferably 100 to 450° C.

When the temperature of the wafer 200 is less than 100° C., a process of forming a boron nitride layer (BN layer) and a boron carbon nitride layer (BCN layer) to be described below may not be progressed and a practical deposition rate may not be obtained. When the temperature of the wafer 200 is 100° C. or more, a process of forming a BN layer or a BCN layer on the wafer 200 can be progressed and a practical deposition rate can be obtained.

When the temperature of the wafer 200 exceeds 700° C., a CVD reaction becomes excessively strong (excessive gas phase reaction occurs). Therefore, the film thickness uniformity is easily deteriorated and the control thereof becomes difficult. By lowering the temperature of the wafer 200 to 700° C. or less, an appropriate gas phase reaction can be caused to occur, thereby preventing the deterioration of the film thickness uniformity and enabling the control thereof. In particular, by lowering the temperature of the wafer 200 to 600° C. or less, further 450° C. or less, a more appropriate gas phase reaction can be caused to occur, thereby easily ensuring the film thickness uniformity and facilitating the control thereof.

Therefore, it is preferable that the temperature of the wafer 200 is set to be within a range of 100 to 700° C., preferably 100 to 600° C., and more preferably 100 to 450° C.

By supplying the TMB gas and the NH₃ gas into the process chamber 201 under the above-described conditions, a reaction of adsorbing TMB on the wafer 200 and a reaction of desorbing an organic ligand (a methyl group, which is also referred to as a "methyl ligand" hereinafter) from TMB adsorbed on the wafer 200 can be respectively progressed. The methyl group is one of alkyl groups and the methyl ligand may also be referred to as an alkyl ligand.

That is, by supplying the TMB gas to the wafer 200, TMB can be adsorbed on the surface of the wafer 200. However, in the above adsorption, a physical adsorption mainly occurs under the above-described temperature condition and pressure condition (in particular, on a low-temperature low-pressure side) and a chemical adsorption hardly occurs. In this state, by supplying the plasma-excited NH₃ gas to the wafer 200, an N—C bond included in TMB adsorbed on the surface of the wafer 200 can be broken by high energy of the active NH₃ gas. That is, a catalytic action of the active NH₃ gas makes it possible to break the bond between nitrogen (N) constituting the borazine ring included in TMB adsorbed on the wafer 200 and carbon (C) constituting the methyl ligand bonded to the borazine ring. Therefore, the methyl ligand can be desorbed from TMB adsorbed on the wafer 200. Nitrogen (N) constituting the borazine ring structure included in TMB has a dangling bond by separating the methyl ligand. That is, TMB adsorbed on the wafer 200 has a dangling bond by desorbing the methyl ligand. In this case, hydrogen (hydrogen ligand) may be desorbed from TMB adsorbed on the wafer 200, and boron constituting the borazine ring structure included in TMB may have a dangling bond. Since TMB has the dangling bond, its chemical adsorption on the surface of the wafer 200 is facilitated.

In addition, the desorption reaction of the organic ligand from TMB can be progressed even in the atmosphere of the process chamber 201, i.e., even when TMB is in a vapor state, as well as on the surface of the wafer 200.

That is, by simultaneously supplying the TMB gas and the plasma-excited NH₃ gas into the process chamber 201 and mixing these gases in the gas phase, it is possible to break N—C bonds of TMB gas which is not adsorbed on the surface of the wafer 200. That is, high energy of the plasma-excited active NH₃ gas makes it possible to break the bond between nitrogen (N) constituting the borazine ring included in TMB gas and carbon (C) constituting the methyl ligand bonded to the borazine ring. Therefore, the methyl ligand can be desorbed from the TMB gas. Nitrogen (N) constituting the borazine ring structure included in the TMB gas has a dangling bond by separating the methyl ligand. That is, the TMB gas has a dangling bond by desorbing the methyl ligand. In this case, hydrogen (H) may be desorbed from the TMB gas, and boron (B) constituting the borazine ring structure included in the TMB gas may have a dangling bond. Since the TMB gas has the dangling bond, its chemical adsorption on the surface of the wafer 200 is facilitated when the TMB gas is supplied to the wafer 200.

By progressing a series of reactions described above, it is possible to accelerate the chemical adsorption of TMB (borazine ring structure) having the dangling bond by desorbing the methyl ligand and hydrogen (H) on the surface of the wafer 200. In addition, TMBs (borazine ring structures) each having a dangling bond by desorbing the methyl ligand or hydrogen (H) can be chemically bonded to each other on the surface of the wafer 200. That is, B—N bonds can be formed by constituting a borazine ring structure included in TMB and bonding nitrogen (N) or boron (B) having a dangling bond by separating a methyl ligand or hydrogen (H) and boron (B) or nitrogen (N) having a dangling bond included in another TMB, or boron (B) or nitrogen (N) having had a dangling bond. In this case, the borazine ring structure constituting the borazine ring of TMB is held (maintained) without being broken. As a result, a layer having the borazine ring structure and containing boron (B) and nitrogen (N), i.e., a boron nitride (BN) layer including the borazine ring structure, is formed on the wafer 200.

When a series of reactions described above are progressed, the energy of the NH₃ gas may be appropriately suppressed by reducing the supply flow rate of the NH₃ gas and shortening the supply time of the NH₃ gas. In addition, the energy of the NH₃ gas may be appropriately suppressed by reducing the pressure in the process chamber 201 and reducing the partial pressure of the NH₃ gas in the process chamber 201. In addition, the energy of the NH₃ gas may be appropriately suppressed by reducing the supply of the RF power applied between the rod-shaped electrodes 269 and 270, intermittently supplying the RF power between the rod-shaped electrodes 269 and 270, or shortening the supply time of the RF power between the rod-shaped electrodes 269 and 270. In this way, by appropriately adjusting the supply condition of the $NH_3$ gas, at least a part of N—C bonds included in TMB can be held (maintained) without being broken, and carbon (C) components included in the methyl ligand can be included (remain) in the BN layer. As a result, a layer having the borazine ring structure and containing boron (B), carbon (C), and nitrogen (N), i.e., a boron carbon nitride (BCN) layer including the borazine ring structure, is formed on the wafer 200.

The supply of TMB gas thermally activated by non-plasma is preferable because the above-described reaction can be softly progressed and the formation of the BN layer (or the BCN layer) including the borazine ring structure is facilitated. That is, as compared to the supply of the TMB gas excited by plasma, the supply of the TMB gas thermally activated by non-plasma is preferable because the borazine ring structure included in TMB is held without being destroyed and is easily incorporated in the BN layer (or the BCN layer).

The TMB gas is mixed with the plasma-excited $NH_3$ gas in the process chamber 201 and is indirectly excited by the plasma-excited $NH_3$ gas. Therefore, the supply condition of the plasma-excited $NH_3$ gas is also one of the important factors for causing a series of reactions described above while the borazine ring structure of TMB is held. Examples of the important factors (condition) for causing a series of reactions described above while the borazine ring structure of TMB is held may include the temperature of the wafer 200 and the inside pressure of the process chamber 201, and it is considered that the temperature of the wafer 200 is particularly involved. By appropriately controlling these, it is possible to cause an appropriate reaction.

When certain time has elapsed and a BN layer (or a BCN layer) having a predetermined thickness is formed on the wafer 200, the valve 243a is closed to stop the supply of the TMB gas into the process chamber 201.

Besides the TMB gas, for example, TEB gas, TPB gas, TIPB gas, TBB gas, TIBB gas, or the like may be used as the borazine-based gas.

Besides the plasma-excited $NH_3$ gas, for example, nitrogen hydride gas, such as plasma-excited diazene ($N_2H_2$) gas, hydrazine ($N_2H_4$) gas, and $N_3H_8$ gas, or gas containing these compounds may be used as the ligand desorption gas. In addition, besides the above-described gases, plasma-excited argon (Ar) gas, helium (He) gas, nitrogen ($N_2$) gas, chlorine ($Cl_2$) gas, or hydrogen chloride (HCl) gas may be used as the ligand desorption gas. The nitrogen hydride-based gas such as $NH_3$ gas, or chlorine-based gas such as $Cl_2$ gas or HCl gas may be activated by heat and then supplied, without plasma excitation. In addition, the ligand desorption gas is not limited to the above examples and any type of gas can be freely selected as long as the gas can impart the energy required to cause the desorption reaction of the organic ligand with respect to TMB which is adsorbed on the wafer 200 or TMB which is in the gas phase.

[Step 2]

When step 1 described above is performed, reaction by-products are generated in the process chamber 201. The reaction by-products are a factor that deteriorates the film quality of the film incorporated in the finally formed BN film (or BCN film) and reduces the deposition rate of the film. After step 1 is performed, the reaction by-products are removed from the process chamber 201.

In this step, the valve 243a is closed and the supply of the TMB gas into the process chamber 201 is stopped. In this case, the inside of the process chamber 201 continues to be vacuum-exhausted by the vacuum pump 246 while the APC valve 244 is opened. Therefore, the TMB gas remaining in the process chamber 201, which does not react or has contributed to the formation of the BN layer (or the BCN layer), and the reaction by-products are removed from the process chamber 201. In this case, the valve 243d are opened to supply $N_2$ gas into the process chamber 201. The $N_2$ gas is supplied into the process chamber 201 through the nozzle 249a and is exhausted from the exhaust pipe 231. The $N_2$ gas acts as a purge gas to increase the effect of removing the TMB gas remaining in the process chamber 201 or reaction by-products from the process chamber 201.

In addition, in this step, the RF power is continuously applied between the rod-shaped electrodes 269 and 270 while the valve 243b is opened. That is, the plasma-excited $NH_3$ gas is continuously supplied into the process chamber 201. The plasma-excited $NH_3$ gas is supplied into the process chamber 201 through the buffer chamber 237 and is exhausted from the exhaust pipe 231. Similar to the $N_2$ gas, the plasma-excited $NH_3$ gas acts as the purge gas and also acts a reforming gas to reform the BN layer (or the BCN layer) formed in step 1.

That is, by continuously supplying the plasma-excited $NH_3$ gas to the wafer 200, the methyl ligand or hydrogen (H) can be desorbed from TMB physically adsorbed on the wafer 200 (the layer formed in step 1) at the time when step 1 has been completed, and TMB can be chemically adsorbed on the wafer 200 (the layer formed in step 1). In addition, the breaking of N—C bonds or B—H bonds included in the layer formed in step 1 can be accelerated, and the methyl ligand or hydrogen (H) remaining in the layer, i.e., the remaining ligand (methyl ligand and hydrogen (H)) included in the layer while maintaining the bonded state without being separated from nitrogen (N) or boron (B) constituting the borazine ring structure in step 1 can be desorbed from the layer. Thus, the formation of the B—N bonds or the like can be accelerated by bonding nitrogen (N) or boron (B) having a dangling bond by separating a methyl ligand or hydrogen (H) and boron (B) or nitrogen (N) having a dangling bond included in the layer, or boron (B) or nitrogen (N) having had a dangling bond. Therefore, after step 1 is completed, the layer formed in step 1 can be reformed into a strong layer having a lot of B—N bonds by continuously supplying the plasma-excited $NH_3$ gas. In addition, carbon (C) concentration in the layer formed in step 1 can be finely adjusted.

The supply flow rate of the $N_2$ gas, which is controlled by the MFC 241d, is set to be within, for example, a range of 100 to 10,000 sccm. A time for which the $N_2$ gas and the $NH_3$ gas are supplied to the wafer 200, i.e., a gas supply time (irradiation time), is set to be within, for example, a range of 1 to 180 seconds, preferably a range of 1 to 120 seconds, and more preferably a range of 1 to 60 seconds. The other process conditions are the same as, for example, the process conditions in step 1 described above.

When certain time has elapsed and the removal of the TMB gas remaining in the process chamber 201 or the reaction by-products from the process chamber 201 is completed, the valve 243d is closed to stop the supply of the $N_2$ gas into the process chamber 201. In this case, the plasma-excited $NH_3$ gas is continuously supplied into the process chamber 201 while the valve 243b is opened.

In this step, the TMB gas remaining in the process chamber 201 or the reaction by-products may not be completely removed, and the inside of the process chamber 201 may not be completely purged. When the amount of the gas remaining in the process chamber 201 is small, an adverse effect will not occur in step 1 to be performed in a next cycle.

The flow rate of the $N_2$ gas, which is supplied into the process chamber 201, also need not be large. For example, by supplying the $N_2$ gas in substantially the same amount as the volume of the reaction tube 203 (process chamber 201), the purge can be performed to the extent that an adverse effect will not occur in step 1 to be performed in the next cycle. In this way, by not completely purging the inside of the process chamber 201, the purge time can be shortened and the throughput can be improved. In addition, it is possible to minimize the consumption of the $N_2$ gas.

Besides the $N_2$ gas, rare gas, such as Ar gas, He gas, Ne gas, or Xe gas, may also be used as the inert gas. Besides the plasma-excited $NH_3$ gas, various gases described above may also be used as the ligand desorption gas.

(Performing Predetermined Number of Times)

A BN film (or a BCN film) including a borazine ring structure with a predetermined composition and a predetermined thickness may be formed on the wafer 200 by performing a cycle a predetermined number of times (once or more), the cycle including a process of alternately performing steps 1 and 2 described above, i.e., by intermittently performing step 1 a predetermined number of times, with step 2 being interposed. The above-described cycle is preferably repeated twice or more. That is, a thickness of a BN layer (or a BCN layer) to be formed per a cycle may be set to be less than a desired thickness and the above-described cycle may be repeated twice or more until the BN layer (or the BCN layer) has a desired thickness.

(Purge and Atmospheric Pressure Recovery)

$N_2$ gas is supplied from each of the gas supply pipes 232d and 232e into the process chamber 201 by opening the valves 243d and 243e and is then exhausted from the exhaust pipe 231. The $N_2$ gas acts as a purge gas. Therefore, the inside of the process chamber 201 is purged to thereby remove the gas remaining in the process chamber 201 or the reaction by-products from the process chamber 201 (purge). After that, the atmosphere in the process chamber 201 is replaced with the inert gas (inert gas replacement) and the pressure in the process chamber 201 is recovered to normal pressure (atmospheric pressure recovery).

(Boat Unloading and Wafer Discharging)

The seal cap 219 is moved downward by the boat elevator 115 to open the lower end of the reaction tube 203. Then, the processed wafers 200 are unloaded from the lower end of the reaction tube 203 to the outside of the reaction tube 203 while being supported by the boat 217 (boat unloading). The processed wafers 200 are discharged from the boat 217 (wafer discharging).

(3) Effects of the Present Embodiment

According to the present embodiment, one or more effects to be described below may be obtained.

(a) In step 1, the supply of the TMB gas to the wafer 200 and the supply of the plasma-excited $NH_3$ gas to the wafer 200 are simultaneously performed. As a result, the high energy of the active $NH_3$ gas makes it possible to desorb the methyl ligand or hydrogen (H) from TMB which is adsorbed on the wafer 200 and TMB which is in the gas phase. TMB (borazine ring structure) having a dangling bond by desorbing the methyl ligand or hydrogen (H) can be chemically bonded on the surface of the wafer 200. In addition, TMBs (borazine ring structures) each having a dangling bond by desorbing the methyl ligand or hydrogen (H) can be chemically bonded to each other on the surface of the wafer 200. Therefore, the BN layer (or the BCN layer) including the borazine ring structure can be efficiently formed even under the temperature condition and the pressure condition exemplified in step 1. As a result, the formation of the BN film (or the BCN film) including the borazine structure on the wafer 200 can be progressed at a practical deposition rate.

In the case of supplying the TMB gas alone to the wafer 200 without supplying the plasma-excited $NH_3$ gas, it is difficult to form the BN film (or the BCN film) including the borazine structure on the wafer 200 under the temperature condition and the pressure condition described above. In addition, in the case of performing the supply of the TMB gas to the wafer 200 and the supply of the plasma-excited $NH_3$ gas to the wafer 200 alternately, i.e., non-simultaneously, it is difficult to perform the formation of the BN film (or the BCN film) including the borazine structure on the wafer 200 at a practical deposition rate under a condition except for a high temperature region in the above-described temperature condition and a condition except for a high pressure region in the above-described pressure condition. That is, under the temperature condition and the pressure condition described above, a practical deposition rate is effectively obtained by simultaneously performing the supply of the TMB gas and the supply of the plasma-excited $NH_3$ gas and desorbing the methyl ligand and hydrogen (H) from TMB by using the high energy of the active $NH_3$ gas.

(b) By alternately performing step 1 and step 2, i.e., intermittently performing step 1, with step 2 being interposed, it is possible to suppress reaction by-products from being incorporated in the finally formed BN film (or BCN film). That is, the film quality of the finally formed film can be improved by performing step 1 not continuously but intermittently until the BN film (or the BCN film) has a desired thickness and performing step 2 of removing reaction by-products from the process chamber 201 during a period when step 1 is stopped. In addition, a reduction in the deposition rate, which is caused by the reaction by-products, can be suppressed by performing step 2 of removing the reaction by-products from the process chamber 201 in the middle of the film forming process and resuming step 1 after the removal of the reaction by-products from the process chamber 201.

(c) By alternately performing step 1 and step 2, i.e., intermittently performing step 1, with step 2 being interposed, it is possible to improve a step coverage and a film thickness controllability of the finally formed BN film (or BCN film).

(d) By performing step 1 under a condition that the borazine ring structure is held in the TMB gas, the borazine ring structure is incorporated in the finally formed film. Thus, the film can be formed to have a high dielectric constant. In addition, by performing step 2 under a condition that the borazine ring structure included in the BN layer (or the BCN layer) formed in step 1 is held in the TMB gas, the finally formed film can be a high dielectric constant film including a lot of borazine ring structures.

This is because the film (porous film) including the borazine ring structure has a lower intra-film atom density and a lower dielectric constant than a film having no borazine ring structure (a non-porous film). Therefore, by including the borazine ring structure in the finally formed film, the film can be formed to have a higher dielectric constant than a BN film having no borazine ring structure or a BCN film having no borazine ring structure.

(e) By performing step 1 under a condition that the borazine ring structure is held in the TMB gas, the borazine ring structure is incorporated in the finally formed film. Thus, the film can be formed to have a high oxidation resistance. In addition, by performing step 2 under a condition that the borazine ring structure included in the BN layer (or the BCN layer) formed in step 1 is held in the TMB gas, the finally formed film can be a highly oxidation-resistant film including a lot of borazine ring structures.

This is because the film including the borazine ring structure contains boron (B) as an element of the borazine ring structure constituting the film. B—N bonds constituting the borazine ring structure have a small deviation (small polarity) of shared electrons and have a strong bond. Therefore, by including the borazine ring structure in the finally formed film, a desorption probability of boron (B) from the film by oxidation can be more reduced than a BN film having no borazine ring structure or a BCN film having no borazine ring structure. That is, it is possible to improve the oxidation resistance of the film, i.e., asking resistance.

(f) By continuously supplying the plasma-excited $NH_3$ gas in step 2, it is possible to reform the film formed in step 1. That is, the film formed in step 1 can be reformed into a strong layer having a lot of B—N bonds, and carbon (C) concentration of the layer can be finely adjusted. Therefore, the finally formed film can be formed as a strong film having a lot of B—N bonds, and carbon (C) concentration of the finally formed film can be finely adjusted.

(g) The TMB gas having an organic ligand in one molecule and also acting as a carbon (C) source is used as the borazine-based gas. By using such a TMB gas, an appropriate amount of carbon (C) can be contained in the finally formed film. That is, by using the TMB gas as the borazine-based gas and appropriately adjusting the supply condition of the $NH_3$ gas used as the ligand desorption gas as described above, at least a part of N—C bonds included in TMB can be held without being broken, and carbon (C) components can be included in the finally formed film. That is, carbon (C) components can be included in the finally formed film, without newly adding step of supplying carbon-containing gas such as, for example, $C_3H_6$ gas or the like. By including an appropriate amount of carbon (C) in the film, it is possible to increase a resistance of the film to hydrogen fluoride (HF), i.e., etching resistance or the like.

(h) The above-described effects can also be obtained even when a gas except for the TMB gas is used as the borazine-based gas including the ligand or when a gas except for the $NH_3$ gas is used as the ligand desorption gas.

(4) Modified Example

The film forming sequence according to the present embodiment is not limited to the embodiment illustrated in FIG. 4, and the following modified examples can be made thereto.

Modified Example 1

Figure 5:
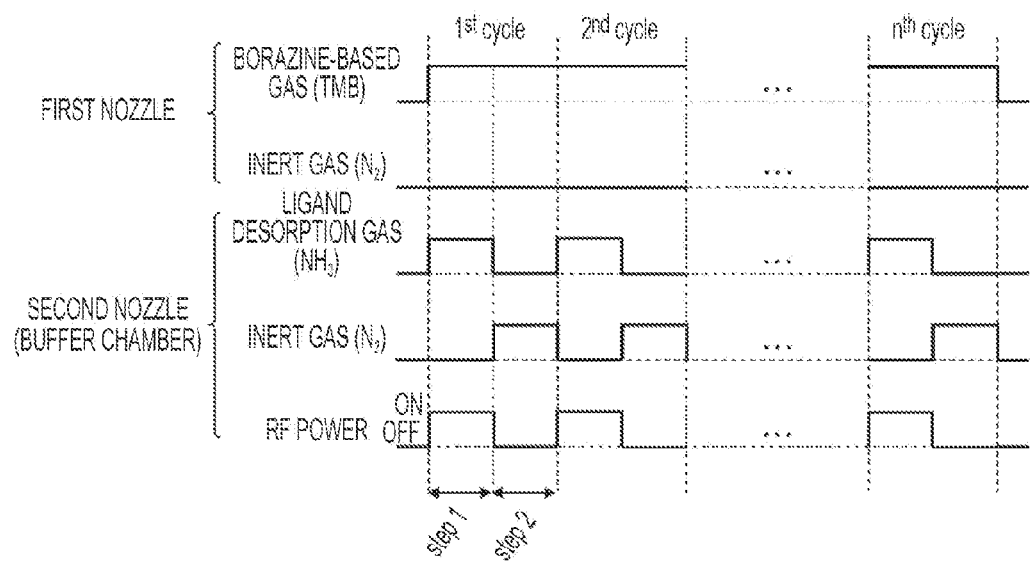
FIG. 5 is a diagram illustrating a gas supply timing in modified example 1 of the film forming sequence according to the embodiment of the present invention.

As illustrated in FIG. 5, plasma-excited $NH_3$ gas may be intermittently supplied while TMB gas is continuously supplied. In this case, in step 2, the supply of the $NH_3$ gas into the process chamber 201 and the application of the RF power between the rod-shaped electrodes 269 and 270 are stopped, and the supply of the TMB gas into the process chamber 201 is continued. Also, in this case, in step 2, $N_2$ gas is supplied from the nozzle 249b (second nozzle) instead of the nozzle 249a (first nozzle). The $N_2$ gas is supplied from the buffer chamber 237 into the process chamber 201, without being excited by plasma. In the present disclosure, the film forming sequence of modified example 1 may be represented as follows.

(Continuous Supply of TMB)+(Intermittent Supply of $NH_3$*) ⇒ BN film or BCN film According to the present modified example, the same effects as the film forming sequence illustrated in FIG. 4 can also be obtained. The TMB gas supplied in step 2 acts as a purge gas along with the $N_2$ gas supplied from the nozzle 249b. However, as compared to the present modified example, the film forming sequence illustrated in FIG. 4 is preferable in that the use amount of expensive TMB gas not contributing to the film formation can be decreased, thereby reducing the film forming costs.

Modified Example 2

Figure 6:
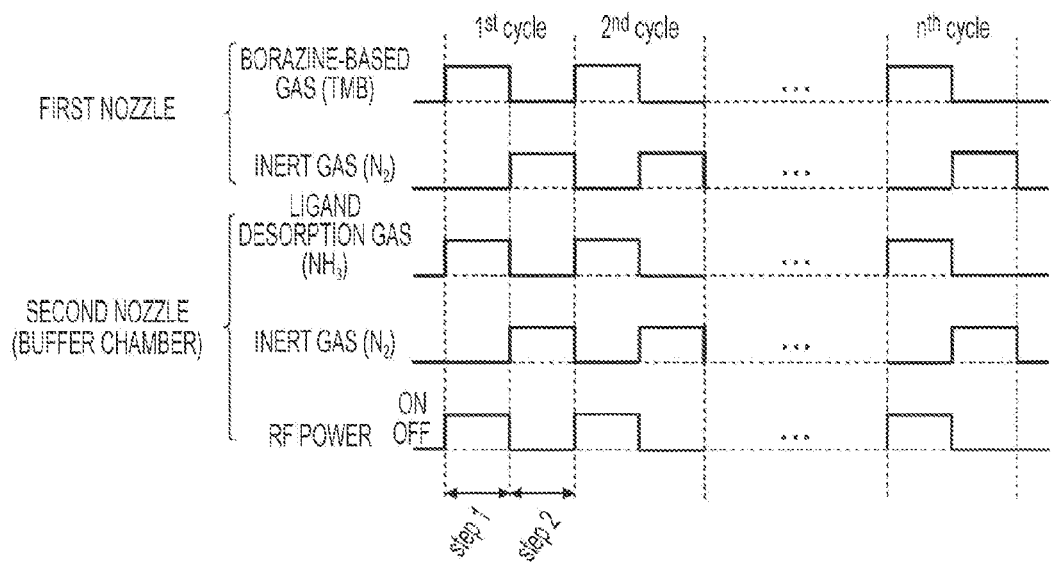
FIG. 6 is a diagram illustrating a gas supply timing in modified example 2 of the film forming sequence according to the embodiment of the present invention.

As illustrated in FIG. 6, both of TMB gas and plasma-excited $NH_3$ gas may be intermittently supplied. That is, in step 2, the inside of the process chamber 201 may be purged with $N_2$ gas by stopping the supply of the TMB gas and the plasma-excited $NH_3$ gas. In this case, in step 2, the application of the RF power between the rod-shaped electrodes 269 and 270 is stopped. Also, in this case, in step 2, the $N_2$ gas is supplied from both of the nozzles 249a and 249b. In the present disclosure, the film forming sequence of modified example 2 may be represented as follows.

Intermittent Supply of [TMB+$NH_3$*] ⇒ BN film or BCN film

According to the present modified example, the same effects as the film forming sequence illustrated in FIG. 4 can also be obtained. In addition, by supplying neither the TMB gas nor the $NH_3$ gas and completely removing residual gas in the process chamber 201 in step 2, it is possible to reliably suppress the generation of reaction by-products due to the residual gas. Moreover, the use amount of the $NH_3$ gas and the TMB gas not contributing to the film formation can be decreased, thereby reducing the film forming costs.

Modified Example 3

Figure 7:
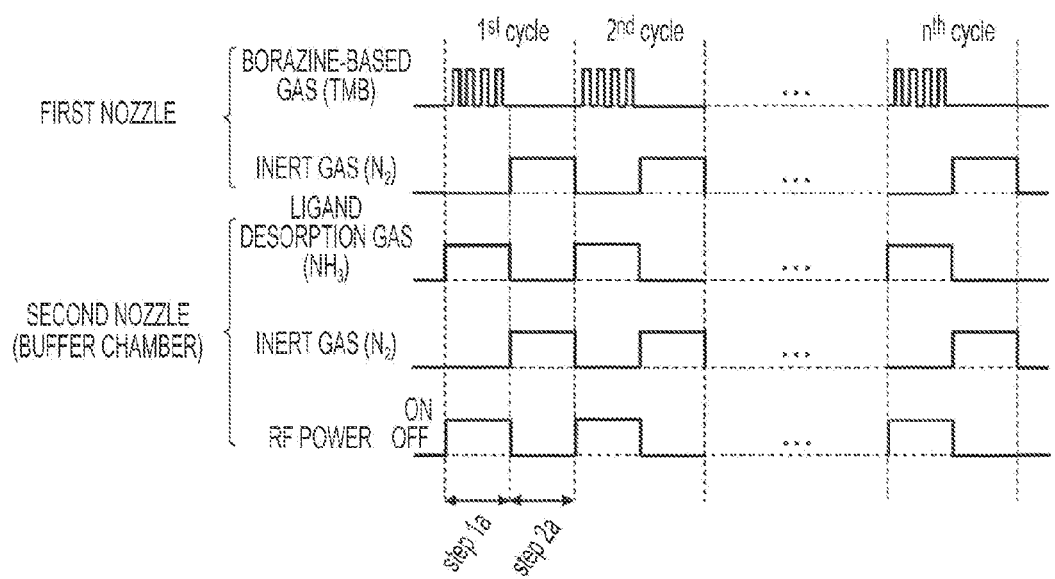
FIG. 7 is a diagram illustrating a gas supply timing in modified example 3 of the film forming sequence according to the embodiment of the present invention.

As illustrated in FIG. 7, step 1a of intermittently supplying the TMB gas while continuously supplying the plasma-excited $NH_3$ gas and step 2a of purging the inside of the process chamber 201 with the $N_2$ gas by supplying neither the TMB gas nor the plasma-excited $NH_3$ gas may be alternately performed a predetermined number of times (n times). FIG. 7 illustrates an example of intermittently supplying the TMB gas four times in step 1a. The modified example may be regarded as intermittently performing the film forming sequence (step 1a) illustrated in FIG. 4, with step (step 2a) of purging the inside of the process chamber 201 with the $N_2$ gas being interposed. In the present disclosure, the film forming sequence of modified example 3 may be represented as follows.

(Continuous Supply of $NH_3$*+Intermittent Supply of TMB)×n ⇒ BN film or BCN film According to the present modified example, the same effects as the film forming sequence illustrated in FIG. 4 can also be obtained. In addition, by supplying neither the TMB gas nor the $NH_3$ gas and completely removing residual gas in the process chamber 201 in step 2a, it is possible to reliably suppress the generation of reaction by-products due to the residual gas. Moreover, the use amount of the $NH_3$ gas and the TMB gas not contributing to the film formation can be decreased, thereby reducing the film forming costs.

Modified Examples 4 and 5

According to the following film forming sequences (modified examples 4 and 5 in sequence), a BN film (or a BCN film) including a borazine ring structure may be formed on a wafer 200. According to these modified examples, the same effects as the film forming sequence illustrated in FIG. 4 or the above-described modified examples can also be obtained.

(Continuous Supply of TMB+Intermittent Supply of NH$_3$*)×n ⇒ BN film or BCN film

[(Continuous Supply of NH$_3$*+Intermittent Supply of TMB)→(Continuous Supply of TMB+Intermittent Supply of NH$_3$*)]×n ⇒ BN film or BCN film Modified Examples 7 and 8

Figure 8:
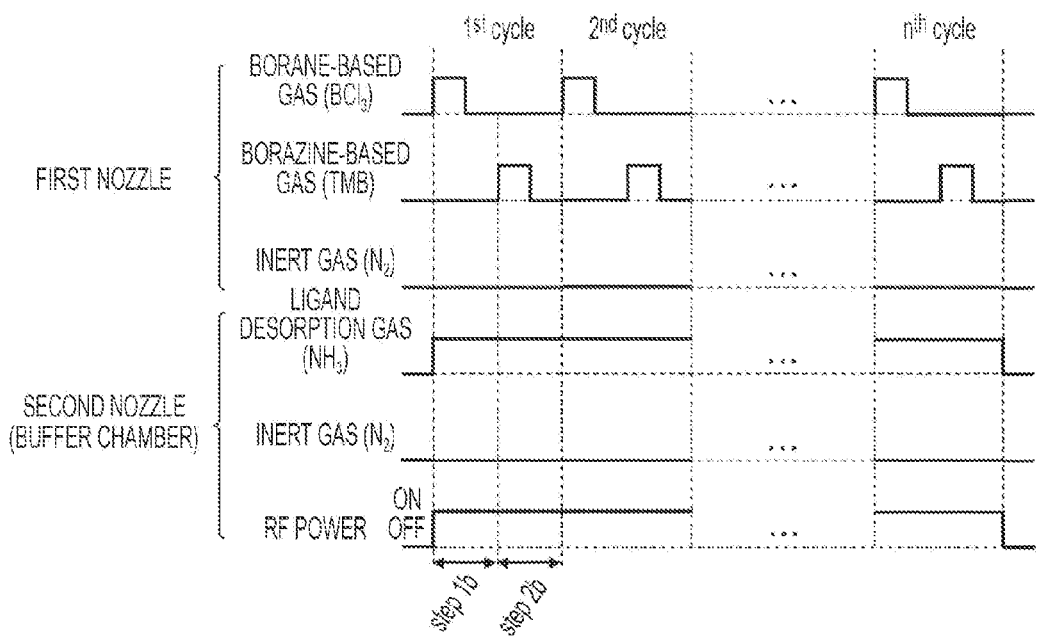
FIG. 8 is a diagram illustrating a gas supply timing in modified example 7 of the film forming sequence according to the embodiment of the present invention.
Figure 9:
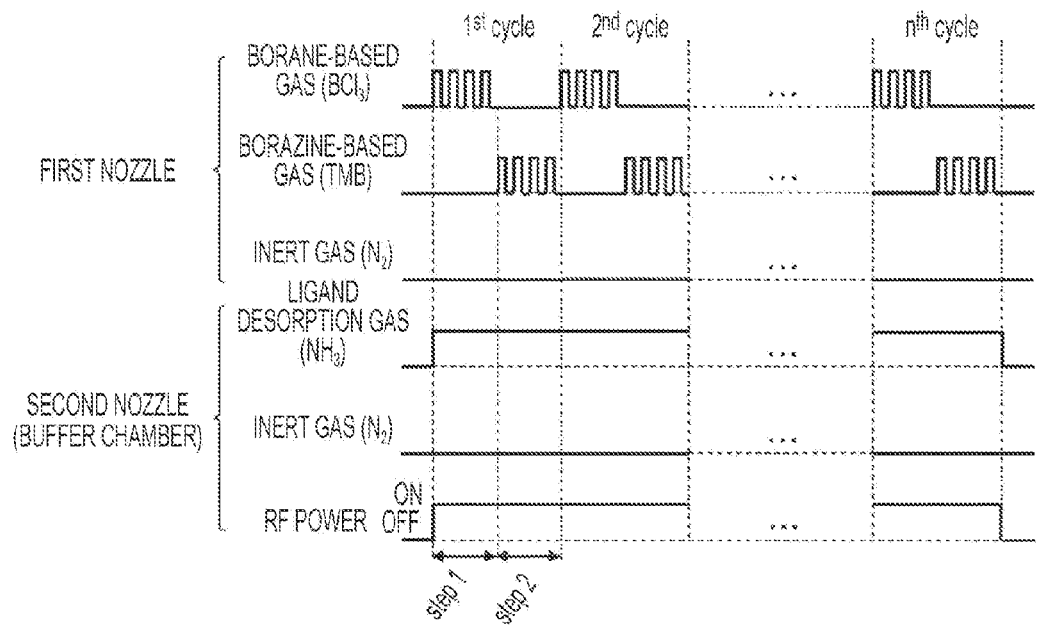
FIG. 9 is a diagram illustrating a gas supply timing in modified example 8 of the film forming sequence according to the embodiment of the present invention.

As illustrated in FIGS. 8 and 9, step of supplying BCl$_3$ gas which is non-borazine-based boron-containing gas may be included in the film forming sequence. That is, step 1b of intermittently performing a process of simultaneously performing the supply of the BCl$_3$ gas and the supply of the plasma-excited NH$_3$ gas as well as step 2b of intermittently performing a process of simultaneously performing the supply of the TMB gas and the supply of the plasma-excited NH$_3$ gas may be performed. That is, the TMB gas and the BCl$_3$ gas may be intermittently supplied while the NH$_3$ gas is continuously supplied. FIG. 8 illustrates an example of intermittently performing the supply of the BCl$_3$ gas and the TMB gas, respectively, once in steps 1b and 2b, and FIG. 9 illustrates an example of intermittently performing the supply of the BCl$_3$ gas and the TMB gas, respectively, four times in steps 1b and 2b. In the present disclosure, the film forming sequences of modified examples 7 and 8 may be sequentially represented as follows.

Continuous Supply of NH$_3$*+(BCl$_3$→TMB)×n ⇒ BN film or BCN film

Continuous Supply of NH$_3$*+(Intermittent Supply of BCl$_3$→Intermittent Supply of TMB)×n ⇒ BN film or BCN film According to these modified examples, the same effects as the film forming sequence illustrated in FIG. 4 can also be obtained.

In addition, by performing the film forming process by further using the nitrogen-free BCl$_3$ gas containing boron (B) in addition to the TMB gas containing boron (B) and nitrogen (N), it is possible to precisely control a ratio (B/N ratio) of boron (B) components to nitrogen (N) components contained in the finally formed film, i.e., a composition ratio of the film. In addition, by performing the film forming process by further using carbon-free BCl$_3$ gas in addition to the TMB gas containing carbon (C), it is possible to finely adjust carbon (C) concentration of the finally formed film.

In addition, it is possible to improve the surface roughness of the finally formed film by performing step 1b of supplying the BCl$_3$ gas before step 2b of supplying the TMB gas, i.e., by performing step 1b of supplying the BCl$_3$ gas at the beginning of the film forming process. In addition, it is possible to further improve the surface roughness of the finally formed film by performing step 1b of supplying the BCl$_3$ gas at the end of the film forming process. The "surface roughness" means a height difference in a wafer in-plane or an arbitrary target surface. The improvement in the surface roughness means that the height difference is reduced, i.e., the surface becomes smooth. The deterioration in the surface roughness means that the height difference is increased, i.e., the surface becomes rough.

Modified Example 9

In the film forming sequence illustrated in FIG. 4 or each of the above-described modified examples, the borazine-based gas such as the BCl$_3$ gas or the like, i.e., the boron-containing gas having no borazine ring structure may be supplied simultaneously with the borazine-based gas such as the TMB gas or the like. That is, the supply of the BCl$_3$ gas may be performed simultaneously with the supply of the TMB gas. According to the present modified example, the same effects as the film forming sequence illustrated in FIG. 4 or each of the above-described modified examples can also be obtained. In addition, according to the present modified example, since boron (B) components contained in the BCl$_3$ gas can be added to the finally formed film, it is possible to increase boron (B) concentration of the finally formed film.

Modified Example 10

In the film forming sequence illustrated in FIG. 4 or the above-described modified examples, the NH$_3$ gas may be thermally activated by non-plasma and then supplied. In this case, the energy of the NH$_3$ gas is appropriately controlled, so that at least a part of N—C bonds included in TMB is held without being broken. As a result, a BCN film including a borazine ring structure is formed on the wafer 200. According to the present modified example, the same effects as the film forming sequence illustrated in FIG. 4 or the above-described modified examples can also be obtained.

Modified Example 11

In the film forming sequence illustrated in FIG. 4 or the above-described modified examples, when the TMB gas and the activated NH$_3$ gas are supplied to the wafer 200 in step 1, the APC valve 244 is closed or the opening degree thereof is set to be small, and these gases are substantially confined in the process chamber 201. By confining these gases in the process chamber 201, it is possible to sufficiently ensure a staying time of the TMB gas and the NH$_3$ gas in the process chamber 201. That is, it is possible to sufficiently increase the probability that TMB will be adsorbed on (come into contact with) the wafer 200 and also sufficiently ensure a reaction time necessary for desorbing a methyl ligand or hydrogen (H) from TMB which is adsorbed on the wafer 200 and TMB which is in a gas phase. As a result, the formation of the BN film (or the BCN film) including the borazine structure on the wafer 200 can be more efficiently performed. Moreover, the use amount of the NH$_3$ gas and the TMB gas not contributing to the film formation can be decreased, thereby reducing the film forming costs. The plasma-excited NH$_3$ gas tends to be easily deactivated as the pressure in the process chamber 201 increases. Therefore, the confinement of the above-described gases in the process chamber 201 is particularly effective to the case where the NH$_3$ gas is thermally activated by non-plasma and then supplied as in modified example 10.

Modified Example 12

In the film forming sequence illustrated in FIG. 4 or each of the above-described modified examples, step of supplying carbon-containing gas such as C$_3$H$_6$ gas to the wafer 200 may be further performed. The step of supplying the C$_3$H$_6$ gas may be performed non-simultaneously with the step of supplying the TMB gas or the step of supplying the BCl$_3$ gas, and may be performed simultaneously with at least one of these processes. According to the present modified example, the same effects as the film forming sequence illustrated in FIG. 4 or each of the above-described modified examples can also be obtained. In addition, according to the present modified example, since carbon (C) components contained in the $C_3H_6$ gas can be added to the finally formed film, it is possible to increase carbon (C) concentration of the finally formed film.

(Process Conditions)

In the modified example, in the step of supplying the $BCl_3$ gas to the wafer 200, the supply flow rate of the $BCl_3$ gas, which is controlled by the MFC 241a, is set to be within, for example, a range of 100 to 10,000 sccm. The pressure in the process chamber 201 is set to be within, for example, a range of 1 to 2,666 Pa, and preferably a range of 67 to 1,333 Pa. A time for which the $BCl_3$ gas is supplied to the wafer 200, i.e., a gas supply time (irradiation time), is set to be within, for example, a range of 1 to 180 seconds, preferably a range of 1 to 120 seconds, and more preferably a range of 1 to 60 seconds. The other process conditions are the same as, for example, the process conditions in step 1 of the film forming sequence illustrated in FIG. 4. In addition to the $BCl_3$ gas, for example, chloroborane-based gas except for the $BCl_3$ gas, fluoroborane-based gas such as trifluoroborane ($BF_3$) gas, or bromoborane-based gas such as tribromoborane ($BBr_3$) gas can be used as the boron-containing gas. Furthermore, chlorine-free borane-based gas such as $B_2H_6$ gas can be used. Moreover, besides these inorganic borane-based gases, organic borane-based gas can be used.

In addition, in the step of activating $NH_3$ gas by heat and supplying the $NH_3$ gas to the wafer 200, the supply flow rate of the $NH_3$ gas, which is controlled by the MFC 241b, is set to be within, for example, a range of 100 to 10,000 sccm. The pressure in the process chamber 201 is set to be within, for example, a range of 1 to 4,000 Pa, and preferably a range of 1 to 3,000 Pa. A time for which the $NH_3$ gas is supplied to the wafer 200, i.e., a gas supply time (irradiation time), is set to be within, for example, a range of 1 to 180 seconds, preferably a range of 1 to 120 seconds, and more preferably a range of 1 to 60 seconds. The other process conditions are the same as, for example, the process conditions in step 1 or step 2 of the film forming sequence illustrated in FIG. 4. Besides the $NH_3$ gas, for example, nitrogen hydride gas, such as diazene ($N_2H_2$) gas, hydrazine ($N_2H_4$) gas, and $N_3H_8$ gas, or gas containing these compounds can be used as the nitrogen-containing gas.

In addition, in the step of supplying the $C_3H_6$ gas to the wafer 200, the supply flow rate of the $C_3H_6$ gas, which is controlled by the MFC 241c, is set to be within, for example, a range of 100 to 10,000 sccm. The pressure in the process chamber 201 is set to be within, for example, a range of 1 to 5,000 Pa, and preferably a range of 1 to 4,000 Pa. A time for which the $C_3H_6$ gas is supplied to the wafer 200, i.e., a gas supply time (irradiation time), is set to be within, for example, a range of 1 to 180 seconds, preferably a range of 1 to 120 seconds, and more preferably a range of 1 to 60 seconds. The other process conditions are the same as, for example, the process conditions in step 1 or step 2 of the film forming sequence illustrated in FIG. 4. Besides the $C_3H_6$ gas, for example, a hydrocarbon-based gas, such as acetylene ($C_2H_2$) gas or ethylene ($C_2H_4$) gas, can be used as the carbon-containing gas.

In the other steps, the process procedures and the process conditions are the same as, for example, the process procedures and the process conditions of each step in the film forming sequence illustrated in FIG. 4.

Other Embodiments of the Present Invention

So far, the embodiments of the present invention have been specifically described. However, the present invention is not limited to the above-described embodiments, and various modifications can be made thereto without departing from the scope of the present invention.

For example, in the above-described embodiments, the example of simultaneously supplying the borazine-based gas and the ligand desorption gas to the wafer 200 has been described, but the present invention is not limited to these embodiments. For example, these gases may be supplied to the wafer 200 non-simultaneously, i.e., without being synchronized. However, as compared to the non-simultaneous supply of these gases, the simultaneous supply of these gases is preferable in that it is possible to efficiently perform the desorption of the ligand from the borazine-based gas and it is easy to improve the deposition rate of the finally formed film.

In addition, for example, in the above-described embodiments, the example of using the organic borazine-based gas including the organic ligand as the borazine-based gas has been described, but the present invention is not limited to these embodiments. For example, as the borazine-based gas, a halogenated borazine-based gas including a halogen ligand, such as n,n',n"-trichloroborazine ((abbreviated as TCB) gas, n,n',n"-trifluoroborazine (abbreviated as TFB) gas, n,n',n"-tribromoborazine (abbreviated as TBB) gas, or n,n',n"-triiodoborazine (abbreviated as TIB) gas, i.e., an inorganic borazine-based gas containing an inorganic ligand may be used. TCB is a borazine compound in which each of $R_1$, $R_3$, and $R_5$ is hydrogen (H) and each of $R_2$, $R_4$, and $R_6$ is a chloro group (Cl) in the chemical structural formula illustrated in FIG. 10B. TFB is a borazine compound in which each of $R_1$, $R_3$, and $R_5$ is hydrogen (H) and each of $R_2$, $R_4$, and $R_6$ is a fluoro group (F) in the chemical structural formula illustrated in FIG. 10B. TBB is a borazine compound in which each of $R_1$, $R_3$, and $R_5$ is hydrogen (H) and each of $R_2$, $R_4$, and $R_6$ is a bromo group (Br) in the chemical structural formula illustrated in FIG. 10B. TIB is a borazine compound in which each of $R_1$, $R_3$, and $R_5$ is hydrogen (H) and each of $R_2$, $R_4$, and $R_6$ is an iodine group (I) in the chemical structural formula illustrated in FIG. 10B. In the film forming sequence illustrated in FIG. 4, when the inorganic borazine-based gas is used as the borazine-based gas, the finally formed film becomes a carbon-free BN film including a borazine ring structure.

The boron-based insulating film formed by the method of the film forming sequence illustrated in FIG. 4 or each of the modified examples is used as a sidewall spacer. Due to this, it is possible to provide a device formation technology having a small leak current and excellent processability. In addition, by using the above-described boron-based insulating film as an etch stopper, it is possible to provide a device formation technology having excellent processability. Moreover, according to some modified examples, since the boron-based insulating film can be formed without using plasma, for example, it is possible to apply to a process having concerns about plasma damage, such as an SADP film or the like of DPT.

It is preferable that (a plurality of) process recipes used for the formation of the above-described various thin films (program in which process procedures or process conditions of the substrate processing is specified) are separately prepared according to the contents of the substrate processing (film type of a film to be formed, a composition ratio, film quality, film thickness, process procedures, process conditions, etc.). It is preferable that, when the substrate processing is started, a suitable recipe is appropriately selected from the plurality of recipes according to the contents of the substrate processing. Specifically, it is preferable that the plurality of recipes separately prepared according to the contents of the substrate processing are previously stored (installed) in the memory device 121c provided in the substrate processing apparatus through a telecommunication line or a recording medium (external memory device 123) storing the relevant recipe. It is preferable that, when the substrate processing is started, the CPU 121a provided in the substrate processing apparatus appropriately selects a suitable recipe from the plurality of recipes stored in the memory device 121c according to the contents of the substrate processing. Due to such a configuration, films having various film types, composition ratios, film qualities, and film thicknesses can be formed for general purposes and with good reproducibility by a single substrate processing apparatus. In addition, since the workload of an operator (input/output load of the process procedure, process conditions, etc.) can be reduced, the substrate processing can be promptly started while avoiding erroneous operations.

The above-described process recipe is not limited to the case of newly creating a process recipe. For example, the process recipe may be prepared by modifying an existing recipe having already been installed on the substrate processing apparatus. When the recipe is modified, the modified recipe may be installed on the substrate processing substrate through the telecommunication line or the recording medium storing the relevant recipe. In addition, the existing recipe having already been installed on the substrate processing apparatus may be directly modified by operating the I/O device 122 provided in the existing substrate processing apparatus.

In the above-described embodiments, the example of forming the thin film by using a batch-type substrate processing apparatus which processes a plurality of substrates at a time has been described. However, the present invention is not limited to the above-described embodiments. For example, the present invention can be preferably applied to the case of forming a thin film by using a single-wafer-type substrate processing apparatus which processes one substrate or a plurality of substrates at a time. Also, in the above-described embodiments, the example of forming the thin film by using a hot-wall-type substrate processing apparatus has been described. However, the present invention is not limited to the above-described embodiments. For example, the present invention can be preferably applied to the case of forming a thin film by using a cold-wall-type substrate processing apparatus. In these cases, the process procedures and the process conditions can be the same as, for example, the process procedures and the process conditions of the above-described embodiments.

Figure 11A:
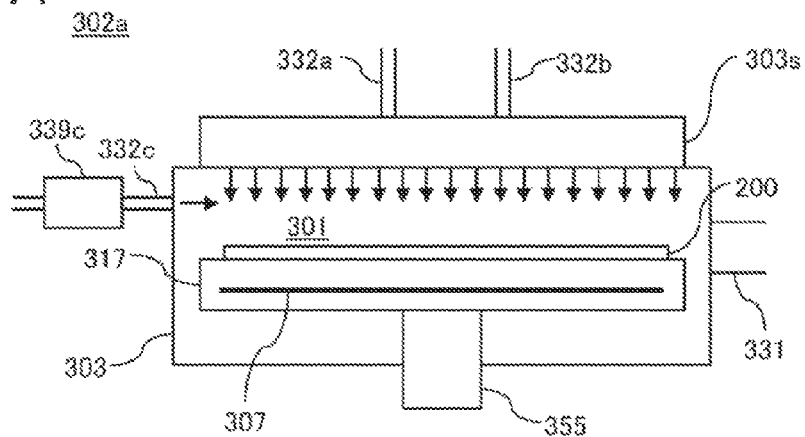
FIG. 11A is a schematic configuration diagram of a process furnace of a substrate processing apparatus suitably used in another embodiment of the present invention.

For example, the present invention can also be preferably applied to the case of forming a film by using a substrate processing apparatus including a process furnace 302a illustrated in FIG. 11A. The process furnace 302a includes a process vessel 303 configured to form a process chamber 301, a shower head 303s configured to supply gas into the process chamber 301 in a shower shape, a support table 317 configured to support one wafer 200 or a plurality of wafers 200 in a horizontal posture, a rotational shaft 355 configured to support the support table 317 from below, and a heater 307 provided in the support table 317. A gas supply port 332a configured to supply the above-described borazine-based gas and a gas supply port 332b configured to supply the above-described boron-containing gas and carbon-containing gas are connected to an inlet (gas introduction port) of the shower head 303s. A gas supply port 332c configured to supply the above-described ligand desorption gas is connected to a sidewall of the process vessel 303, i.e., a side of an edge of the wafer 200 loaded into the process chamber 301. The same gas supply system as the borazine-based gas supply system of the above-described embodiment is connected to the gas supply port 332a. The same gas supply systems as the boron-containing gas supply system and the carbon-containing gas supply system of the above-described embodiment are connected to the gas supply port 332b. A remote plasma unit (plasma generation device) 339c serving as an excitation unit configured to excite the above-described ligand desorption gas by plasma and supply the plasma-excited ligand desorption gas, and the same gas supply system as the ligand desorption gas supply system of the above-described embodiment are connected to the gas supply port 332c. A gas distribution plate configured to supply the gas into the process chamber 301 in a shower shape is provided in an outlet (gas discharge port) of the shower head 303s. The shower head 303s is provided at a position opposite to (facing) the surface of the wafer 200 loaded into the process chamber 301, and the gas supply port 332c is provided at a position that is opposite to the surface of the wafer 200 loaded into the process chamber 301. An exhaust port 331 configured to exhaust the inside of the process chamber 301 is provided in the process vessel 303. The same exhaust system as the exhaust system of the above-described embodiment is connected to the exhaust port 331.

Figure 11B:
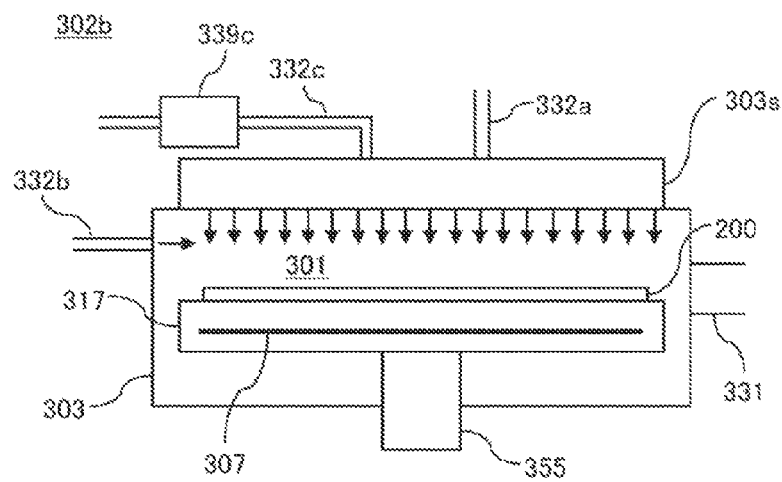
FIG. 11B is a schematic configuration diagram of a process furnace of a substrate processing apparatus suitably used in another embodiment of the present invention.

In addition, for example, the present invention can also be preferably applied to the case of forming a film by using a substrate processing apparatus including a process furnace 302b illustrated in FIG. 11B. A gas supply port 332a configured to supply the above-described borazine-based gas and a gas supply port 332c configured to supply the above-described ligand desorption gas are connected to an inlet of a shower head 303s. A gas supply port 332b configured to supply the above-described boron-containing gas and carbon-containing gas is connected to a sidewall of a process vessel 303, i.e., a side of an edge of a wafer 200 loaded into a process chamber 301. The same gas supply system as the borazine-based gas supply system of the above-described embodiment is connected to the gas supply port 332a. The same gas supply systems as the boron-containing gas supply system and the carbon-containing gas supply system of the above-described embodiment are connected to the gas supply port 332b. The same gas supply systems as the above-described remote plasma unit 339c and the same gas supply system as the ligand desorption gas supply system of the above-described embodiment are connected to the gas supply port 332c. The shower head 303s is provided at a position opposite to (facing) the surface of the wafer 200 loaded into the process chamber 301, and the gas supply port 332b is provided at a position that is not opposite to the surface of the wafer 200 loaded into the process chamber 301. Besides, the same reference numerals are assigned to components configured similarly to the process furnace 302a illustrated in FIG. 11A, and descriptions thereof will be omitted.

Figure 11C:
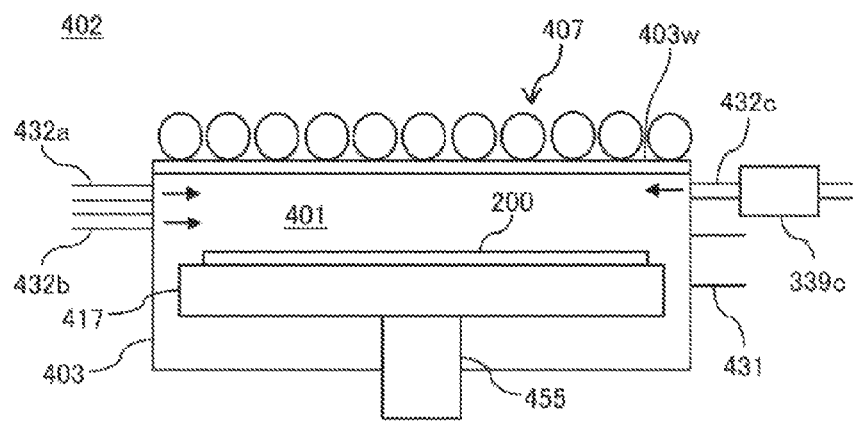
FIG. 11C is a schematic configuration diagram of a process furnace of a substrate processing apparatus suitably used in another embodiment of the present invention.

In addition, for example, the present invention can also be preferably applied to the case of forming a film by using a substrate processing apparatus including a process furnace 402 illustrated in FIG. 11C. The process furnace 402 includes a process vessel 403 configured to form a process chamber 401, a support table 417 configured to support one wafer 200 or a plurality of wafers 200 in a horizontal posture, a rotational shaft 455 configured to support the support table 417 from below, a lamp heater 407 configured to irradiate light toward the wafers 200 in the process vessel 403, and a quartz window 403w configured to transmit the light of the lamp heater 407. A gas supply port 432a configured to supply the above-described borazine-based gas, a gas supply port 432b configured to supply the above-described boron-containing gas and carbon-containing gas, and a gas supply port 432c configured to supply the above-described ligand desorption gas are connected to the process vessel 403. The same gas supply system as the borazine-based gas supply system of the above-described embodiment is connected to the gas supply port 432a. The same gas supply systems as the boron-containing gas supply system and the carbon-containing gas supply system of the above-described embodiment are connected to the gas supply port 432b. The same gas supply systems as the above-described remote plasma unit 339c and the same gas supply system as the ligand desorption gas supply system of the above-described embodiment are connected to the gas supply port 432c. The gas supply ports 432a to 432c are provided at sides of edges of the wafers 200 loaded into the process chamber 401, i.e., position that are not opposite to the surfaces of the wafers 200 loaded into the process chamber 401. An exhaust port 431 configured to exhaust the inside of the process chamber 401 is provided in the process vessel 403. The same exhaust system as the exhaust system of the above-described embodiment is connected to the exhaust port 431.

Even in the case of using these substrate processing apparatuses, the film formation can be performed under the same sequences and process conditions as those of the above-described embodiments or modified examples.

In addition, the above-described embodiments or modified examples can be used in combination as appropriate. Moreover, the process conditions at this time can be the same as, for example, the process conditions of the above-described embodiments.

<Preferred Aspects of the Present Invention>

Hereinafter, preferred aspects of the present invention will be supplementarily described below.

(Supplementary Note 1)

According to one aspect of the present invention, there is provided a method of manufacturing a semiconductor device, including forming a film having a borazine ring structure and containing boron and nitrogen on a substrate by intermittently performing an act of simultaneously performing: (a) supplying borazine-based gas including a ligand to the substrate; and (b) supplying a ligand desorption gas which desorbs the ligand to the substrate, wherein the (a) and (b) are performed under a condition where the borazine ring structure in the borazine-based gas is held.

(Supplementary Note 2)

In the method according to Supplementary Note 1, preferably, the forming of the film includes stopping the supply of at least one selected from a group consisting of the borazine-based gas and the ligand desorption gas. That is, the forming of the film includes a process (period) of not supplying at least one selected from a group consisting of the borazine-based gas and the ligand desorption gas.

(Supplementary Note 3)

In the method according to Supplementary Note 1 or 2, preferably, the forming of the film includes intermittently supplying one of the borazine-based gas and the ligand desorption gas while the other of the borazine-based gas and the ligand desorption gas is continuously supplied.

(Supplementary Note 4)

In the method according to any one of Supplementary Notes 1 to 3, preferably, the forming of the film includes intermittently supplying the borazine-based gas while the ligand desorption gas is continuously supplied.

(Supplementary Note 5)

In the method according to any one of Supplementary Notes 1 to 4, preferably, the forming of the film includes intermittently supplying the ligand desorption gas while the borazine-based gas is continuously supplied.

(Supplementary Note 6)

In the method according to any one of Supplementary Notes 1 to 5, preferably, the forming of the film includes a process (period) of stopping the supply of the borazine-based gas and the ligand desorption gas.

(Supplementary Note 7)

In the method according to any one of Supplementary Notes 1 to 6, preferably, the forming of the film includes stopping the supply of the borazine-based gas and the ligand desorption gas, and purging a space where the substrate is present.

(Supplementary Note 8)

In the method according to any one of Supplementary Notes 1 to 7, preferably, in the forming of the film, the ligand desorption gas is excited to a plasma state and is then supplied to the substrate.

(Supplementary Note 9)

In the method according to any one of Supplementary Notes 1 to 8, preferably, the forming of the film further includes supplying non-borazine-based boron-containing gas to the substrate.

(Supplementary Note 10)

In the method according to Supplementary Note 9, preferably, the forming of the film further includes intermittently performing an act of simultaneously performing: (c) supplying the boron-containing gas; and (d) supplying the ligand desorption gas.

(Supplementary Note 11)

In the method according to Supplementary Note 9 or 10, preferably, in the forming of the film, the borazine-based gas and the boron-containing gas are intermittently supplied while the ligand desorption gas is continuously supplied.

(Supplementary Note 12)

In the method according to any one of Supplementary Notes 9 to 11, preferably, the supplying of the boron-containing gas is performed before the supplying of the borazine-based gas.

(Supplementary Note 13)

In the method according to any one of Supplementary Notes 1 to 12, preferably, the ligand includes an organic ligand.

(Supplementary Note 14)

In the method according to any one of Supplementary Notes 1 to 13, preferably, the ligand desorption gas includes a nitrogen-containing gas (nitrogen hydride gas).

(Supplementary Note 15)

According another aspect of the present invention, there is provided a substrate processing apparatus including: a process chamber configured to accommodate a substrate; a borazine-based gas supply system configured to supply borazine-based gas including a ligand to the substrate in the process chamber; a ligand desorption gas supply system configured to supply ligand desorption gas which desorbs the ligand to the substrate in the process chamber; a heater configured to heat the substrate in the process chamber; a pressure regulator configured to regulate a pressure in the process chamber; and a controller configured to control the borazine-based gas supply system, the ligand desorption gas supply system, the heater, and the pressure regulator so as to form a film having a borazine ring structure and containing boron and nitrogen on the substrate by intermittently performing an act of simultaneously performing: (a) supplying the borazine-based gas to the substrate in the process chamber; and (b) supplying the ligand desorption gas to the substrate in the process chamber, wherein the (a) and (b) are performed under a condition where the borazine ring structure in the borazine-based gas is held.

(Supplementary Note 16)

According another aspect of the present invention, there is provided a non-transitory computer-readable recording medium storing a program configured to cause a computer to perform forming a film having a borazine ring structure and containing boron and nitrogen on a substrate by intermittently performing an act of simultaneously performing: (a) supplying borazine-based gas including a ligand to the substrate; and (b) supplying a ligand desorption gas which desorbs the ligand to the substrate, wherein the (a) and (b) are performed under a condition where the borazine ring structure in the borazine-based gas is held.

What is claimed is:

1. A method of manufacturing a semiconductor device, comprising forming a film having a borazine ring structure and containing boron and nitrogen on a substrate by intermittently performing an act of simultaneously performing:
   (a) supplying borazine-based gas including a ligand to the substrate; and
   (b) supplying a ligand desorption gas which desorbs the ligand to the substrate,
   wherein the (a) and (b) are performed under a condition where the borazine ring structure in the borazine-based gas is held.

2. The method according to claim 1, wherein the forming of the film comprises stopping the supply of at least one selected from a group consisting of the borazine-based gas and the ligand desorption gas.

3. The method according to claim 1, wherein the forming of the film comprises intermittently supplying one of the borazine-based gas and the ligand desorption gas while the other of the borazine-based gas and the ligand desorption gas is continuously supplied.

4. The method according to claim 1, wherein the forming of the film comprises intermittently supplying the borazine-based gas while the ligand desorption gas is continuously supplied.

5. The method according to claim 1, wherein the forming of the film comprises intermittently supplying the ligand desorption gas while the borazine-based gas is continuously supplied.

6. The method according to claim 1, wherein the forming of the film comprises stopping the supply of the borazine-based gas and the ligand desorption gas.

7. The method according to claim 1, wherein the forming of the film comprises stopping the supply of the borazine-based gas and the ligand desorption gas, and purging a space where the substrate is present.

8. The method according to claim 1, wherein, in the forming of the film, the ligand desorption gas is excited to a plasma state and is then supplied to the substrate.

9. The method according to claim 1, wherein the forming of the film further comprises supplying non-borazine-based boron-containing gas to the substrate.

10. The method according to claim 9, wherein the forming of the film further comprises intermittently performing an act of simultaneously performing:
    (c) supplying the boron-containing gas; and
    (d) supplying the ligand desorption gas.

11. The method according to claim 9, wherein, in the forming of the film, the borazine-based gas and the boron-containing gas are intermittently supplied while the ligand desorption gas is continuously supplied.

12. The method according to claim 9, wherein the supplying of the boron-containing gas is performed before the supplying of the borazine-based gas.

13. The method according to claim 1, wherein the ligand comprises an organic ligand.

14. The method according to claim 1, wherein the ligand desorption gas comprises a nitrogen-containing gas.

15. A substrate processing apparatus comprising:
    a process chamber configured to accommodate a substrate;
    a borazine-based gas supply system configured to supply borazine-based gas including a ligand to the substrate in the process chamber;
    a ligand desorption gas supply system configured to supply ligand desorption gas which desorbs the ligand to the substrate in the process chamber;
    a heater configured to heat the substrate in the process chamber;
    a pressure regulator configured to regulate a pressure in the process chamber; and
    a controller configured to control the borazine-based gas supply system, the ligand desorption gas supply system, the heater, and the pressure regulator so as to form a film having a borazine ring structure and containing boron and nitrogen on the substrate by intermittently performing an act of simultaneously performing:
    (a) supplying the borazine-based gas to the substrate in the process chamber; and
    (b) supplying the ligand desorption gas to the substrate in the process chamber,
    wherein the (a) and (b) are performed under a condition where the borazine ring structure in the borazine-based gas is held.

16. A non-transitory computer-readable recording medium storing a program configured to cause a computer to perform forming a film having a borazine ring structure and containing boron and nitrogen on a substrate by intermittently performing an act of simultaneously performing:
    (a) supplying borazine-based gas including a ligand to the substrate; and
    (b) supplying a ligand desorption gas which desorbs the ligand to the substrate,
    wherein the (a) and (b) are performed under a condition where the borazine ring structure in the borazine-based gas is held.

* * * * *